(12) United States Patent
Takizawa et al.

(10) Patent No.: US 7,432,036 B2
(45) Date of Patent: *Oct. 7, 2008

(54) NON-RESONANT TWO-PHOTON ABSORBING MATERIAL, NON-RESONANT TWO-PHOTON EMITTING MATERIAL, AND METHOD FOR INDUCING ABSORPTION OR GENERATING EMISSION OF NON-RESONANT TWO PHOTONS BY USING THE MATERIAL

(75) Inventors: Hiroo Takizawa, Kanagawa (JP); Takeharu Tani, Kanagawa (JP); Naoki Morinaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 247 days.

This patent is subject to a terminal disclaimer.

(21) Appl. No.: 10/678,301

(22) Filed: Oct. 6, 2003

(65) Prior Publication Data

US 2004/0086803 A1 May 6, 2004

(30) Foreign Application Priority Data

| Oct. 7, 2002 | (JP) | .................. P.2002-293720 |
| Mar. 11, 2003 | (JP) | .................. P.2003-065580 |
| Mar. 17, 2003 | (JP) | .................. P.2003-071874 |
| Mar. 17, 2003 | (JP) | .................. P.2003-071875 |

(51) Int. Cl.
*G11B 7/24* (2006.01)

(52) U.S. Cl. .................. 430/270.18; 430/270.2; 430/945; 428/64.8

(58) Field of Classification Search .................. None
See application file for complete search history.

(56) References Cited

U.S. PATENT DOCUMENTS

| 2,170,807 | A | * | 8/1939 | Brooker ..................... 544/300 |
| 2,706,193 | A | * | 4/1955 | Sprague ..................... 544/300 |
| 4,288,861 | A | * | 9/1981 | Swainson et al. ........... 365/127 |
| 4,568,647 | A | * | 2/1986 | Sanford ..................... 436/88 |
| 4,743,529 | A | * | 5/1988 | Farid et al. ............... 430/281.1 |
| 4,996,138 | A | * | 2/1991 | Murai et al. ................ 430/522 |
| 5,035,977 | A | * | 7/1991 | DeBoer et al. ............. 430/200 |
| 5,230,986 | A | * | 7/1993 | Neckers ................. 430/281.1 |
| 5,325,324 | A | * | 6/1994 | Rentzepis et al. ........... 365/127 |
| 5,741,623 | A | * | 4/1998 | Namba et al. .......... 430/270.19 |
| 5,891,738 | A | * | 4/1999 | Soini et al. ................. 436/501 |
| 6,342,379 | B1 | * | 1/2002 | Tsien et al. ............... 435/173.4 |
| 6,667,830 | B1 | * | 12/2003 | Iketaki et al. ................ 359/368 |
| 7,112,616 | B2 | * | 9/2006 | Takizawa et al. .............. 522/8 |
| 2001/0003032 | A1 | * | 6/2001 | Harada et al. ............... 430/302 |
| 2002/0114027 | A1 | * | 8/2002 | Horimai ....................... 359/11 |
| 2002/0127563 | A1 | | 9/2002 | Salafsky |
| 2004/0131969 | A1 | * | 7/2004 | Takizawa et al. ....... 430/270.18 |
| 2004/0204513 | A1 | * | 10/2004 | Takizawa et al. ............... 522/2 |
| 2004/0245432 | A1 | * | 12/2004 | Takizawa .................. 250/208.1 |
| 2005/0003133 | A1 | * | 1/2005 | Akiba et al. ................ 428/64.2 |
| 2005/0019711 | A1 | * | 1/2005 | Takizawa .................... 430/561 |
| 2005/0231776 | A1 | * | 10/2005 | Akiba et al. .................. 359/27 |
| 2006/0083890 | A1 | * | 4/2006 | Takizawa ................... 428/64.1 |

FOREIGN PATENT DOCUMENTS

| FR | 2291256 | * | 7/1976 |
| JP | 60-239948 | * | 11/1985 |
| JP | 03-231741 | * | 10/1991 |
| JP | 08-211552 | A | 8/1996 |
| JP | 10-503588 | T | 3/1998 |
| JP | 63-288786 | * | 11/1998 |
| JP | 2002-210857 | A | 8/2001 |
| JP | 2001-260536 | * | 9/2001 |
| JP | 2003-183213 | * | 7/2003 |
| JP | 2004-149517 | A | 5/2004 |
| WO | WO 95/30909 | A1 | 11/1995 |
| WO | WO 97/09043 | | 3/1997 |

OTHER PUBLICATIONS

Lee et al., "Two photo radiacal photointiator system upon iodiniated benzospiraopyrans" Chem. Mater. vol. 3 pp. 858-864 (1991).*
Feldner et al., "Nonlinear optical properties of specific polymethines: influence of substituents and chain length", Nonlinear Opt. vol. 26 pp. 99-106 (2000).*
Foucault et al. "Two photon absorption in organic dyes—relation withthe symmetry of the levels", Opt. Comm. vol. 15(3) pp. 412-415 (Nov. 12, 1995).*
Kasatani et al., Short wavelengtgh fluorescence caused by sequantial two-photon excitation of some cyaine dyes . . . , Chem. Phys. vol. 83, pp. 461-469 (1984).*
Naqvi et al. "On the long transient absorption observed in nnaosecond laser photolysis . . . "Chem. Phys. Lett., vol. 22(2) pp. 226-229 (Oct. 1973).*
Penzkofer et al., "So and s1 two photon absorption dynamics of organic dyes solutions", Opt. Quantum electron. vol. 19 pp. 327-349 (1987).*
Scherer et al. "Two photon states in squarine monomerds and oligomers", Chem. Lett., vol. 279 pp. 179-207 (2002).*
Albota, Marius et. al, Science, Sep. 1998, p. 1653-1656, vol. 281.
Kajzar, et al., "Third-Order Hyperpolarizability of Centrosymmetric Langmuir-Blodgett Films of Stilbazolium Dyes," *Thin Solid Films* *160*:209-215 (1988).

* cited by examiner

*Primary Examiner*—Martin J Angebranndt
(74) *Attorney, Agent, or Firm*—Sughrue Mion, PLLC

(57) ABSTRACT

A non-resonant two-photon absorbing material is provided, comprising a methine dye undergoing a non-resonant two-photon absorption, in which the methine dye is preferably a cyanine dye, a merocyanine dye or an oxonol dye, and a non-resonant two-photon absorbing material is provided, comprising a non-resonant two-photon absorbing compound undergoing non-resonant two-photon absorption in the intermolecular aggregation state.

2 Claims, No Drawings

NON-RESONANT TWO-PHOTON ABSORBING MATERIAL, NON-RESONANT TWO-PHOTON EMITTING MATERIAL, AND METHOD FOR INDUCING ABSORPTION OR GENERATING EMISSION OF NON-RESONANT TWO PHOTONS BY USING THE MATERIAL

FIELD OF THE INVENTION

The present invention relates to a material of expressing a non-linear optical effect, more specifically, the present invention relates to a non-linear optical material having a large non-resonant two-photon absorbing cross-sectional area and ensuring a high emission efficiency from the excited state resultant of non-resonant two-photon absorption.

BACKGROUND OF THE INVENTION

In general, the non-linear optical effect means a non-linear optical response proportional to the square, cube or higher power of photoelectric field applied. Known examples of the secondary non-linear optical effect proportional to the square of photoelectric field applied include second harmonic generation (SHG), optical rectification, photorefractive effect, Pockels effect, parametric amplification, parametric oscillation, light sum frequency mixing and light difference frequency mixing. Examples of the ternary non-linear optical effect include third harmonic generation (THG), optical Kerr effect, self-induced refractive index change and two-photon absorption.

As the non-linear optical material of exhibiting these non-linear optical effects, a large number of inorganic materials have been heretofore found. However, inorganic materials can be hardly used in practice because so-called molecular design so as to optimize desired non-linear optical characteristics or various properties necessary for the production of a device is difficult. On the other hand, organic compounds can realize not only optimization of desired non-linear optical characteristics by the molecular design but also control of other various properties and therefore, the probability of its practical use is high. Thus, organic compounds are attracting attention as a promising non-linear optical material.

In recent years, among non-linear optical characteristics of the organic compound, ternary non-linear optical effects, particularly, non-resonant two-photon absorption and non-resonant two-photon emission, are being taken notice of. The two-photon absorption is a phenomenon such that a compound is excited by simultaneously absorbing two photons. In the case where the two-photon absorption occurs in the energy region having no (linear) absorption band of the compound, this is called resonant two-photon absorption. The non-resonant two-photon emission means emission generated by an excited molecule resultant of the non-resonant two-photon absorption in the radiation inactivation process of the excited state. In the following, even when not particularly specified, two-photon absorption and two-photon emission indicate non-resonant two-photon absorption and non-resonant two-photon emission, respectively.

The non-resonant two-photon absorption efficiency is proportional to the square of photoelectric field applied (square-law characteristic of two-photon absorption). Therefore, when a laser is irradiated on a two-dimensional plane, two-photon absorption takes place only in the position having a high electric field strength at the center part of laser spot and utterly no two-photon absorption occurs in the portion having a weak electric field strength in the periphery. On the other hand, in a three-dimensional space, two-photon absorption occurs only in the region having a large electric field strength at the focus where the laser rays are converged through a lens, and two-photon absorption does not take place at all in the off-focus region because the electric field strength is weak. As compared with the linear absorption where excitation occurs in all positions proportionally to the strength of photoelectric field applied, in the non-resonant two-photon absorption, excitation occurs only at one point inside the space by virtue of the square-law characteristic and therefore, the space resolution is remarkably enhanced. Usually, in the case of inducing non-resonant two-photon absorption, a short pulse laser in the near infrared region having a wavelength longer than the wavelength region where the (linear) absorption band of a compound is present, and not having the absorption of the compound is used in many cases. Since a near infrared ray in a so-called transparent region where the (linear) absorption band of a compound is not present is used, the excitation light can reach the inside of a sample without being absorbed or scattered and one point inside the sample can be excited with very high space resolution due to the square-law characteristic of non-resonant two-photon absorption. Therefore, application of the non-resonant two-photon absorption and non-resonant two-photon emission to two-photon contrasting of a living organism or two-photon photodynamic therapy is being expected. Furthermore, when non-resonant two-photon absorption and two-photon emission is used, a photon having an energy higher than the energy of incident photon can be taken out, therefore, in view of a wavelength converting device, studies on up-conversion lasing are also reported. In addition, application of the two-photon absorbing compound to three-dimensional optical recording medium, three-dimensional display, three-dimensional stereolithography and the like is also expected.

As the organic compound of undergoing two-photon emission or up-conversion lasing with good efficiency, so-called stilbazolium derivatives are known (see, G. S. He, et al., *Appl. Phys. Lett.*, 67, 3703 (1995), G. S. He, et al., *Appl. Phys. Lett.*, 67, 2433 (1995), G. S. He, et al., *Appl. Phys. Lett.*, 68, 3549 (1996), G. S. He, et al., *J. Appl. Phys.*, 81, 2529 (1997), P. N. Prasad, et al., *Nonlinear Optics*, 21, 39 (1999), Y. Ren, et al., *J. Mater. Chem.*, 10, 2025 (2000), G. Zhou, et al., *Jpn. J. Appl. Phys.*, 40, 1250 (2001), and M. Albota, et al., *Science*, Vol. 281, page 1653 (1998). Furthermore, various applications using the two-photon emission of a stilbazolium compound having a specific structure are described in WO97/09043.

In the case of applying the non-resonant two-photon emission to contrasting of a living organism, photodynamic therapy, up-conversion lasing or the like, the two-photon absorption efficiency (two-photon absorbing cross-sectional area) of the organic compound used and the emission efficiency from the excited state resultant of the two-photon absorption must be high. In order to obtain 2-fold two-photon emission intensity by using the same organic compound, 4-fold excitation light intensity is necessary due to the square-law characteristic of two-photon absorption. However, irradiation of excessively strong laser light highly probably incurs, for example, photo-damage of a living organism or photo-deterioration of the two-photon emitting dye itself and therefore, this is not preferred. Accordingly, in order to obtain strong two-photon emission with weak excitation light intensity, an organic compound of efficiently undergoing two-photon absorption and two-photon emission must be developed. The two-photon emission efficiency of stilbazolium derivatives cannot fully satisfy the performance in practical uses.

With recent progress of the advanced information society, a three-dimensional optical recording medium is abruptly attracting an attention as an ultimate high-density, high-capacity recording medium. In the three-dimensional optical recording medium, bit recording is superposed in tens or hundreds of layers in the three-dimensional (thickness) direction to achieve super high-density and super high-capacity recording as large as tens or hundreds of times conventional two-dimensional recording mediums. In order to provide a three-dimensional optical recording medium, access and writing must be performed at an arbitrary position in the three-dimensional (thickness) direction and as a technique therefor, a method of using a two-photon absorbing material is effective.

In the medical field, a three-dimensional display or three-dimensional stereolithography of enabling many persons to observe a natural solid without spectacles is demanded so as to apply a more adequate therapy to a three-dimensionally intricate site such as brain or ear. As a promising material therefor, a three-dimensional volume display or three-dimensional stereolithography composition using two-photon absorption is expected.

However, for practically using the three-dimensional optical recording medium, three-dimensional volume display or stereolithography composition, a high-speed recording technique is necessary. Since the recording speed is proportional to the two-photon absorbing cross-sectional area, if a known two-photon absorbing compound having a low two-photon absorption efficiency is used, a practical material or system cannot be provided. Under these circumstances, development of a compound having a very large two-photon absorbing cross-sectional area is keenly demanded.

As described above, use of non-resonant two-photon absorption and non-resonant two-photon emission enables various applications characterized by very high space resolution. However, two-photon emitting compounds usable at present are low in the two-photon absorbing ability and also bad in the two-photon emission efficiency and therefore, a very high-output laser is necessary as an excitation light source of inducing two-photon absorption and two-photon emission.

SUMMARY OF THE INVENTION

An object of the present invention is to provide an organic material capable of absorbing two photons with good efficiency, namely, an organic material having a large two-photon absorbing cross-sectional area, and also provide an organic material capable of exhibiting two-photon emission having a large emission intensity.

The present inventors have made extensive investigations, as a result, the object of the present invention can be attained by the following techniques.

1. A non-resonant two-photon absorbing material comprising a methine dye undergoing a non-resonant two-photon absorption.

2. The non-resonant two-photon absorbing material as described in the item 1, wherein the methine dye is at least one selected from the group consisting of a cyanine dye, a merocyanine dye and an oxonol dye.

3. The non-resonant two-photon absorbing material as described in the item 2, wherein the cyanine dye, the merocyanine dye and the oxonol dye are represented by the following formulae (1), (2) and (3), respectively:

Formula (1):

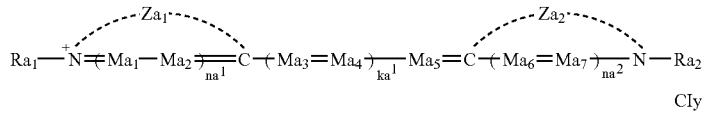

4. The non-resonant two-photon absorbing material as described in the item 3, wherein $na^1$, $na^2$ and $na^3$ all represent 0.

5. The non-resonant two-photon absorbing material as described in the item 2 or 3, wherein the cyanine dye, the merocyanine dye and the oxonol dye are represented by the following formulae (4), (5) and (6), respectively:

Formula (2):

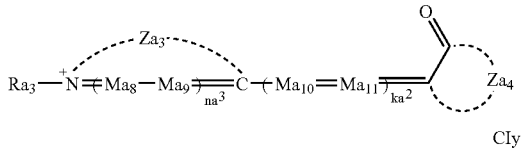

Formula (4):

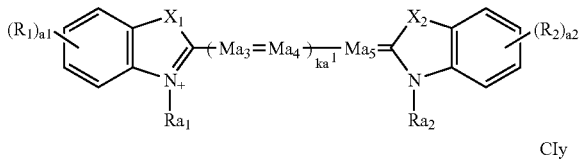

Formula (5):

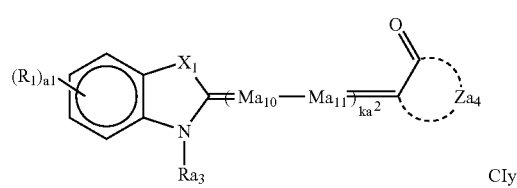

Formula (6):

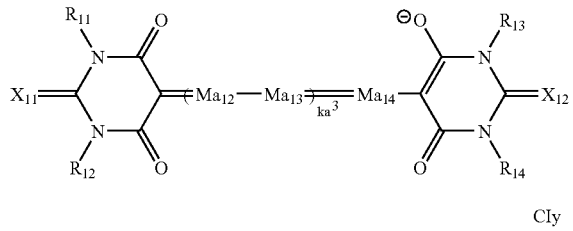

wherein in formula (4), $Ra_1$ and $Ra_2$, $Ma_3$ to $Ma_5$, $ka^1$, CI and y have the same meanings as in the formula (1), $X_1$ and $X_2$ each independently represents —O—, —S—, —$NR_3$— or —$CR_4R_5$—, $R_3$, $R_4$ and $R_5$ each independently represents a hydrogen atom, an alkyl group, an alkenyl group, an aryl group or a heterocyclic group, $R_1$ and $R_2$ each independently represents a substituent, and a1 and a2 each independently represents an integer of 0 to 4, provided that when a1 and a2 each is 2 or more, multiple $R_1$s may be the same or different and may combine with each other to form a ring and multiple $R_2$s may be the same or different and may combine with each other to form a ring;

in formula (5), $X_1$, $R_3$, $R_4$, $R_5$, $R_1$ and a1 have the same meanings as in the formula (4), and $Ma_{10}$, $Ma_{11}$, $Ra_3$, $Za_4$, $ka^2$, CI and y have the same meanings as in the formula (2), provided that when a1 is 2 or more, multiple $R_1$s may be the same or different and may combine with each other to form a ring; and in formula (6), $Ma_{12}$ to $Ma_{14}$, $ka^3$, CI and y have the same meanings as in the formula (3), $X_{11}$ and $X_{12}$ each independently represents either O or S, and $R_{11}$ to $R_{14}$ each independently represents a hydrogen atom, an alkyl group, an alkenyl group, an aryl group or a heterocyclic group.

6. The non-resonant two-photon absorbing material as described in any one of the items 3 to 5, wherein $ka^1$ and $ka^3$ each is an integer of 0 to 2 and $ka^2$ is an integer Formula (3):

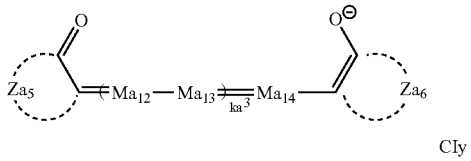

wherein $Za_1$, $Za_2$ and $Za_3$ each represents an atomic group for forming a 5- or 6-membered nitrogen-containing heterocyclic ring, $Za_4$, $Za_5$ and $Za_6$ each represents an atomic group for forming a 5- or 6-membered ring, $Ra_1$, $Ra_2$ and $Ra_3$ each independently represents a hydrogen atom, an alkyl group, an alkenyl group, an aryl group or a heterocyclic group, $Ma_1$ to $Ma_{14}$ each independently represents a methine group, which may have a substituent or may form a ring together with another methine group, $na^1$, $na^2$ and $na^3$ each represents 0 or 1, $ka^1$ and $ka^3$ each represents an integer of 0 to 3, provided that when $ka^1$ is 2 or more, multiple $Ma_3$s may be the same or different and multiple $Ma_4$s may be the same or different and when $ka^3$ is 2 or more, multiple $Ma_{12}$s may be the same or different and multiple $Ma_{13}$s may be the same or different, $ka^2$ represents an integer of 0 to 8, provided that when $ka^2$ is 2 or more, multiple $Ma_{10}$s may be the same or different and multiple $Ma_{11}$, may be the same or different, CI represents an ion for neutralizing the electric charge, and y represents a number necessary for the neutralization of electric charge. of 0 to 4.

7. The non-resonant two-photon absorbing material as described in the item 6, wherein $ka^1$ and $ka^3$ each is 1 or 2 and $ka^2$ is an integer of 1 to 3.

8. The non-resonant two-photon absorbing material as described in any one of the items 3 to 7, wherein $Ra_1$, $Ra_2$ and $Ra_3$ all represent an alkyl group.

9. The non-resonant two-photon absorbing material as described in any one of the items 5 to 8, wherein $R_3$, $R_4$ and $R_5$ all represent an alkyl group.

10. The non-resonant two-photon absorbing material as described in any one of the items 5 to 9, wherein $X_1$ and $X_2$ in formula (4) each independently represents —O—, —$NR_3$— or —$CR_4R_5$—.

11. The non-resonant two-photon absorbing material as described in the item 10, wherein at least one of $X_1$ and $X_2$ represents —O— or —$NR_3$—.

12. The non-resonant two-photon absorbing material as described in the item 11, wherein at least one of $X_1$ and $X_2$ represents —O—.

13. The non-resonant two-photon absorbing material as described in the item 12, wherein $X_1$ and $X_2$ both represent —O—.

14. The non-resonant two-photon absorbing material as described in any one of the items 5 to 13, wherein in formulae (4) and (5), a1 and a2 each independently represents an integer of 0 to 2.

15. The non-resonant two-photon absorbing material as described in any one of the items 5 to 14, wherein in formulae (4) and (5), $R_1$ and $R_2$ each is substituted at the 5-position (respective para-positions of $X_1$ and $X_2$) on the benzene ring.

16. The non-resonant two-photon absorbing material as described in any one of the items 5 to 15, wherein in formula (4), $R_1$ and $R_2$ each independently represents a chlorine atom, a bromine atom, a fluorine atom, an iodine atom, a sulfo group, a methyl group, a phenyl group or a pyrrole group.

17. The non-resonant two-photon absorbing material as described in the item 16, wherein $R_1$ and $R_2$ each independently represents a chlorine atom, a bromine atom, a sulfo group, a methyl group or a phenyl group.

18. The non-resonant two-photon absorbing material as described in the item 16, wherein $R_1$ and $R_2$ each independently represents a chlorine atom or a bromine atom.

19. The non-resonant two-photon absorbing material as described in the item 18, wherein at least one of $R_1$ and $R_2$ represents a chlorine atom.

20. The non-resonant two-photon absorbing material as described in (19), wherein $R_1$ and $R_2$ both are a chlorine atom.

21. The non-resonant two-photon absorbing material as described in the item 20, wherein $X_1$ and $X_2$ both represent —O—, $R_1$ and $R_2$ both represent a chlorine atom, and a1 and a2 both represent 1, in which $R_1$ and $R_2$ each are substituted at the 5-position on the benzene ring.

22. The non-resonant two-photon absorbing material as described in any one of the items 5 to 9, 14 and 15, wherein in formula (5), $X_1$ each independently represents —O—, —S— or —$CR_4R_5$—.

23. The non-resonant two-photon absorbing material as described in any one of the items 3 to 9, 14, 15 and 22, wherein in the formulae (2), (3) and (5), the ring formed by $Za_4$, $Za_5$ or $Za_6$ each is 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione.

24. The non-resonant two-photon absorbing material as described in the item 23, wherein in formulae (2) and (5), the ring formed by $Za_4$ is pyrazolidine-3,5-dione, indane-1,3-dione, 1,3-dioxane-4,6-dione, barbituric acid or 2-thiobarbituric acid.

25. The non-resonant two-photon absorbing material as described in the item 24, wherein the ring formed by $Za_4$ is pyrazolidine-3,5-dione, barbituric acid or 2-thiobarbituric acid.

26. The non-resonant two-photon absorbing material as described in the item 25, wherein the ring formed by $Za_4$ is 2-thiobarbituric acid.

27. The non-resonant two-photon absorbing material as described in any one of the items 3 to 7, wherein in formula (3), the rings formed by $Za_5$ and $Za_6$ each is barbituric acid or 2-thiobarbituric acid.

28. The non-resonant two-photon absorbing material as described in any one of the items 5 to 7 and 27, wherein in formula (6), $X_{11}$ and $X_{12}$ both represent O.

29. The non-resonant two-photon absorbing material as described in any one of the items 5 to 7, 27 and 28, wherein in formula (6), $R_{11}$ to $R_{14}$ each independently represents a hydrogen atom, an alkyl group or an aryl group.

30. The non-resonant two-photon absorbing material as described in any one of the items 3 to 29, wherein in formulae (1) to (6), $Ma_1$ to $Ma_{14}$ each independently represents an unsubstituted methine group, a methyl-substituted methine group or an ethyl-substituted methine group.

31. A non-resonant two-photon absorbing material comprising a non-resonant two-photon absorbing compound undergoing non-resonant two-photon absorption in the intermolecular aggregation state.

32. A non-resonant two-photon absorbing material comprising a non-resonant two-photon absorbing compound represented by any one of the formulae (1) to (6), the non-resonant two-photon absorbing compound undergoing non-resonant two-photon absorption in the intermolecular aggregation state.

33. The non-resonant two-photon absorbing material as described in any one of the items 1 to 32, wherein the non-resonant two-photon absorbing compound has a two-photon absorbing cross-sectional area δ of 1,000 GM or more.

34. The non-resonant two-photon absorbing material as described in any one of the items 1 to 32, wherein the non-resonant two-photon absorbing compound has a two-photon absorbing cross-sectional area δ of 10,000 GM or more.

35. The non-resonant two-photon absorbing material as described in any one of the items 1 to 32, wherein the non-resonant two-photon absorbing compound has a two-photon absorbing cross-sectional area δ of 30,000 GM or more.

36. The non-resonant two-photon absorbing material as described in any one of the items 1 to 32, wherein the non-resonant two-photon absorbing compound has a two-photon absorbing cross-sectional area δ of 60,000 GM or more.

37. A non-resonant two-photon emitting material comprising the non-resonant two-photon emitting dye described in any one of the items 1 to 36, wherein the non-resonant two-photon emitting dye undergoes a two-photon emitting.

38. A method for inducing a non-resonant two-photon absorption, which comprises irradiating the dye undergoing a non-resonant two-photon absorption described in any one of the items 1 to 37 with a laser ray having a wavelength longer than the linear absorption band of the dye to induce a two-photon absorption.

39. A method for inducing a non-resonant two-photon absorption, which comprises irradiating the dye undergoing a non-resonant two-photon absorption described in any one of the items 1 to 38 with a laser ray having a wavelength longer than the linear absorption band of the dye and present in the range of 400 to 1,000 nm to induce a two-photon absorption.

40. A method for inducing a non-resonant two-photon absorption, which comprises irradiating the dye undergoing a non-resonant two-photon absorption described in any one of the items 1 to 38 with a laser ray having a wavelength longer than the linear absorption band of the dye and present in the range of 400 to 800 nm to induce a two-photon absorption.

41. A method for generating an emission, comprising irradiating the dye undergoing a non-resonant two-photon absorption described in the item 37 with a laser ray having a wavelength longer than the linear absorption band of the dye to induce a two-photon absorption and generate an emission.

42. An optical recording medium comprising the non-resonant two-photon absorbing material described in any one of the items 1 to 41.

43. A three-dimensional optical recording medium comprising the non-resonant two-photon absorbing material described in any one of the items 1 to 41.

44. A three-dimensional volume display comprising the non-resonant two-photon absorbing material described in any one of the items 1 to 41.

45. A three-dimensional stereolithography comprising the non-resonant two-photon absorbing material described in any one of the items 1 to 41.

DETAILED DESCRIPTION OF THE INVENTION

The compound of undergoing non-resonant two-photon absorption for use in the present invention is described in detail below.

In the present invention, when a specific moiety is called "a group", unless otherwise indicated, this means that the group may or may not be substituted by one or more (up to the maximum possible number) substituent. For example, "an alkyl group" means a substituted or unsubstituted alkyl group. The substituent which can be used in the compound for use in the present invention may be any substituent.

In the present invention, when a specific moiety is called "a ring" or when "a ring" is contained in "a group", unless otherwise indicated, the ring may be a monocyclic ring or a condensed ring or may or may not be substituted.

For example, "an aryl group" may be a phenyl group or a naphthyl group or may be a substituted phenyl group.

The methine dye of undergoing non-resonant two-photon absorption for use in the present invention is described below.

Incidentally, the dye as used in the present invention is a generic term of compounds having a part of the absorption in the ultraviolet region (200 to 400 nm), visible region (400 to 700 nm) and/or near infrared region (700 to 2,000 nm).

Examples of the methine dye for use in the present invention include cyanine dyes, hemicyanine dyes, strepto-cyanine dyes, styryl dyes, merocyanine dyes, trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, arylidene dyes and polyene dyes.

Among these methine dyes, preferred in the present invention are cyanine dyes, hemicyanine dyes, strepto-cyanine dyes, styryl dyes, merocyanine dyes, oxonol dyes, squalium dyes and arylidene dyes, more preferred are cyanine dyes, merocyanine dyes and oxonol dyes, and most preferred are cyanine dyes.

These dyes are described in detail, for example, in F. M. Harmer, *Heterocyclic Compounds-Cyanine Dyes and Related Compounds*, John Wiley & Sons, New York, London (1964), D. M. Sturmer, *Heterocyclic Compounds-Special topics in heterocyclic chemistry*, Chap. 18, Section 14, pp. 482-515, John Wiley & Sons, New York, London (1977), and *Rodd's Chemistry of Carbon Compounds*, 2nd ed., Vol. IV, Part B, Chap. 15, pp. 369-422, Elsevier Science Publishing Company Inc., New York (1977).

Specific examples of the cyanine, merocyanine and oxonol dyes include those described in F. M. Harmer, *Heterocyclic Compounds-Cyanine Dyes and Related Compounds*, John Wiley & Sons, New York, London (1964).

As for the formulae of the cyanine and merocyanine dyes, formulae (XI) and (XII) described at pages 21 and 22 of U.S. Pat. No. 5,340,694 are preferred (however, the numbers represented by n12 and n15 are not limited and each is an integer of 0 or more (preferably 4 or less)).

The methine dye of undergoing non-resonant two-photon absorption for use in the present invention is preferably a cyanine dye, merocyanine dye or an oxonol dye.

The methine dye of undergoing non-resonant two-photon absorption for use in the present invention is more preferably a cyanine dye represented by formula (1).

In formula (1), $Za_1$ and $Za_2$ each represents an atomic group for forming a 5- or 6-membered nitrogen-containing heterocyclic ring. Preferred examples of the 5- or 6-membered nitrogen-containing heterocyclic ring formed include oxazole nuclei having a carbon number (hereinafter referred to as "a C number") of 3 to 25 (e.g., 2-3-methyloxazolyl, 2-3-ethyloxazolyl, 2-3,4-diethyloxazolyl, 2-3-methylbenzoxazolyl, 2-3-ethylbenzoxazolyl, 2-3-sulfoethylbenzoxazolyl, 2-3-sulfopropylbenzoxazolyl, 2-3-methylthioethylbenzoxazolyl, 2-3-methoxyethylbenzoxazolyl, 2-3-sulfobutylbenzoxazolyl, 2-3-methyl-β-naphthoxazolyl, 2-3-methyl-α-naphthoxazolyl, 2-3-sulfopropyl-β-naphthoxazolyl, 2-3-sulfopropyl-γ-naphthoxazolyl, 2-3-(3-naphthoxyethyl)-benzoxazolyl, 2-3,5-dimethylbenzoxazolyl, 2-6-chloro-3-methylbenzoxazolyl, 2-5-bromo-3-methylbenzoxazolyl, 2-3-ethyl-5-methoxybenzoxazolyl, 2-5-phenyl-3-sulfopropyl-benzoxazolyl, 2-5-(4-bromophenyl)-3-sulfobutylbenzoxazolyl, 2-3-dimethyl-5,6-dimethylthiobenzoxazolyl, 2-3-sulfopropyl-oxazoly, 2-3-sulfopropyl-γ-naphthoxazolyl, 2-3-ethyl-α-naphthoxazolyl, 2-5-chloro-4-ethyl-α-naphthoxazolyl, 2-5-chloro-3-ethylbenzoxazolyl, 2-5-chloro-3-sulfopropylbenzoxazolyl, 2-5,6-dichloro-3-sulfopropylbenzoxazolyl, 2-5-bromo-3-sulfopropylbenzoxazolyl, 2-3-ethyl-5-phenylbenzoxazolyl, 2-5-(1-pyrrolyl)-3-sulfopropylbenzoxazolyl, 2-5,6-dimethyl-3-sulfopropylbenzoxazolyl, 2-3-ethyl-5-sulfobenzoxazolyl), thiazole nuclei having a carbon number of 3 to 25 (e.g., 2-3-methylthiazolyl, 2-3-ethylthiazolyl, 2-3-sulfopropylthiazolyl, 2-3-sulfobutylthiazolyl, 2-3,4-dimethylthiazolyl, 2-3,4,4-trimethylthiazolyl, 2-3-carboxyethylthiazolyl, 2-3-methylbenzothiazolyl, 2-3-ethylbenzothiazolyl, 2-3-butylbenzothiazolyl, 2-3-sulfopropylbenzothiazolyl, 2-3-sulfobutylbenzothiazolyl, 2-3-methyl-β-naphthothiazolyl, 2-3-sulfopropyl-γ-naphthothiazolyl, 2-3-(1-naphthoxyethyl)benzothiazolyl, 2-3,5-dimethylbenzothiazolyl, 2-6-chloro-3-methylbenzothiazolyl, 2-6-iodo-3-methylbenzothiazolyl, 2-5-bromo-3-methylbenzothiazolyl, 2-3-ethyl-5-methoxybenzothiazolyl, 2-5-phenyl-3-sulfopropylbenzothiazolyl, 2-5-(4-bromophenyl)-3-sulfobutylbenzothiazolyl, 2-3-dimethyl-5,6-dimethylthiobenzothiazolyl, 2-5-chloro-3-ethylbenzothiazolyl, 2-5-chloro-3-sulfopropylbenzothiazolyl, 2-3-ethyl-5-iodobenzothiazolyl), imidazole nuclei having a carbon number of 3 to 25 (e.g., 2-1,3-diethylimidazolyl, 2-1,3-dimethylimidazolyl, 2-1-methylbenzimidazolyl, 2-1,3,4-triethylimidazolyl, 2-1,3-diethylbenzimidazolyl, 2-1,3,5-trimethylbenzimidazolyl, 2-6-chloro-1,3-dimethylbenzimidazolyl, 2-5,6-dichloro-1,3-diethylbenzimidazolyl, 2-1,3-disulfopropyl-5-cyano-6-chlorobenzimidazolyl, 2-5,6-dichloro-3-ethyl-1-sulfopropylbenzimidazolyl, 2-5-chloro-6-cyano-1,3-diethylbenzimidazolyl, 2-5-chloro-1,3-diethyl-6-trifluoromethylbenzimidazolyl), indolenine nuclei having a carbon number of 10 to 30 carbon atoms (e.g., 3,3-dimethyl-1-pentylindolenine, 3,3-dimethyl-1-sulfopropylindolenine, 5-carboxy-1,3,3-trimethylindolenine, 5-carbamoyl-1,3,3-trimethylindolenine, 1,3,3-trimethyl-4,5-benzindolenine), quinoline nuclei having a carbon number of 9 to 25 (e.g., 2-1-methylquinolyl, 2-1-ethylquinolyl, 2-1-methyl-6-chloroquinolyl, 2-1,3-diethylquinolyl, 2-1-methyl-6-methylthioquinolyl, 2-1-sulfopropylquinolyl, 4-1-methylquinolyl, 4-1-pentylquinolyl, 4-1-sulfoethylquinolyl, 4-1-methyl-7-chloroquinolyl, 4-1,8-diethylquinolyl, 4-1-methyl-6-methylthioquinolyl, 4-1-sulfopropylquinolyl), selenazole nuclei having a carbon number of 3 to 25 (e.g., 2-3-methylbenzoselenazolyl), pyridine nuclei having a carbon number of 5 to 25 (e.g., 2-pyridyl), thiazoline nuclei, oxazoline nuclei, selenazoline nuclei, tetrazoline nuclei, tetrazole nuclei, benzotellurazole nuclei, imidazoline nuclei, imidazo[4,5-quinoxaline] nuclei, oxadiazole nuclei, thiadiazole nuclei, tetrazole nuclei and pyrimidine nuclei.

The heterocyclic ring may be substituted and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenylcarbamoyl), an acylamino group (preferably having a C number of 1 to 20, e.g., acetylamino, benzoylamino), an imino group (preferably having a C number of 2 to 20, e.g., phthalylimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenylcarbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

The heterocyclic ring may also be condensed with another ring. Preferred examples of the ring with which the heterocyclic ring is condensed include a benzene ring, a benzofuran ring, a pyridine ring, a pyrrole ring, an indole ring and a thiophene ring.

The 5- or 6-membered nitrogen-containing heterocyclic ring formed by $Za_1$ and $Za_2$ is more preferably an oxazole nucleus, an imidazole nucleus, a thiazole nucleus or an indolenine ring, still more preferably an oxazole nucleus, an imidazole nucleus or an indolenine ring, yet still more preferably an oxazole ring or an imidazole ring, and most preferably an oxazole nucleus.

$Ra_1$ and $Ra_2$ each independently represents a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_1$ to $Ma_7$ each represents a methine group and may have a substituent (preferred examples of the substituent are the same as examples of the substituent on $Za_1$ and $Za_2$) The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_1$ to $Ma_7$ each is preferably an unsubstituted methine group or an alkyl group (preferably having a C number of 1 to 6)-substituted methine group, more preferably an unsubstituted methine group, an ethyl group-substituted methine group or a methyl group-substituted methine group.

$Ma_1$ to $Ma_7$ may combine with each other to form a ring and preferred examples of the ring formed include a cyclohexene ring, a cyclopentene ring, a benzene ring and a thiophene ring.

$na^1$ and $na^2$ each is 0 or 1, preferably both are 0.

$ka^1$ represents an integer of 0 to 3, preferably 0 to 2, more preferably 1 or 2.

When $ka^1$ is 2 or more, multiple $Ma_3$s may be the same or different and multiple $Ma_4$s may be the same or different.

CI represents an ion for neutralizing the electric charge and y represents a number necessary for the neutralization of electric charge.

The cyanine dye of undergoing non-resonant two-photon absorption for use in the present invention, represented by formula (1), is more preferably represented by formula (4).

In formula (4), $Ra_1$, $Ra_2$, $Ma_3$ to $Ma_5$, $ka^1$, CI and y have the same meanings as in formula (1) and respective preferred embodiments are also the same.

$X_1$ and $X_2$ each independently represents —O—, —S—, —NR$_3$— or —CR$_4$R$_5$—, and $R_3$, $R_4$ and $R_5$ each independently represents a hydrogen atom, an alkyl group, an alkenyl group, an aryl group or a heterocyclic group (respective preferred examples are the same as those described for $Ra_1$ and $Ra_2$), preferably an alkyl group.

$X_1$ and $X_2$ each is independently preferably —O—, —NR$_3$— or —CR$_4$R$_5$—, more preferably —O— or —NR$_3$—, still more preferably —O—, and most preferably both are —O—.

$R_1$ and $R_2$ each independently represents a substituent (preferred examples of the substituent are the same as examples of the substituent on $Za_1$ and $Za_2$), preferably an alkyl group, an aryl group, a heterocyclic group, a halogen atom, a cyano group, a carboxyl group, a sulfo group, an alkoxy group, a sulfamoyl group, a carbamoyl group or an alkoxycarbonyl group.

a1 and a2 each independently represents an integer of 0 to 4, preferably 0 to 2, more preferably 0 or 1, and most preferably 1.

In this case, $R_1$ and $R_2$ each is independently substituted preferably at the 5-position (respective para-positions of $X_1$ and $X_2$) on the benzene ring.

$R_1$ and $R_2$ each is independently preferably a chlorine atom, a bromine atom, a fluorine atom, an iodine atom, a sulfo group, a methyl group, a phenyl group or a pyrrole group, more preferably a chlorine atom, a bromine atom, a sulfo group, a methyl group or a phenyl group, still more preferably a chlorine atom or a bromine atom, and most preferably a chlorine group.

When a1 and a2 each is 2 or more, multiple $R_1$s may be the same or different and may combine with each other to form a ring and multiple $R_2$s may be the same or different and may combine with each other to form a ring. Preferred examples of the ring formed include a benzene ring, a benzofuran ring, a pyridine ring, a pyrrole ring, an indole ring and a thiophene ring. Among these, a benzene ring and a benzofuran ring are more preferred.

The merocyanine dye of undergoing non-resonant two-photon absorption for use in the present invention is preferably a merocyanine dye represented by formula (2).

In formula (2), $Za_3$ represents an atomic group for forming a 5- or 6-membered nitrogen-containing heterocyclic ring. Preferred examples of the 5- or 6-membered nitrogen-containing heterocyclic ring formed include oxazole nuclei having a carbon number (hereinafter referred to as "a C number") of 3 to 25 (e.g., 2-3-methyloxazolyl, 2-3---ethyloxazolyl, 2-3,4-diethyloxazolyl, 2-3-methylbenzoxazolyl, 2-3-ethylbenzoxazolyl, 2-3-sulfoethylbenzoxazolyl, 2-3-sulfopropylbenzoxazolyl, 2-3-methylthioethylbenzoxazolyl, 2-3-methoxyethylbenzoxazolyl, 2-3-sulfobutylbenzoxazolyl, 2-3-methyl-β-naphthoxazolyl, 2-3-methyl-α-naphthoxazolyl, 2-3-sulfopropyl-β-naphthoxazolyl, 2-3-sulfopropyl-γ-naphthoxazolyl, 2-3-(3-naphthoxyethyl)benzoxazolyl, 2-3,5-dimethylbenzoxazolyl, 2-6-chloro-3-methylbenzoxazolyl, 2-5-bromo-3-methylbenzoxazolyl, 2-3-ethyl-5-methoxybenzoxazolyl, 2-5-phenyl-3-sulfopropylbenzoxazolyl, 2-5-(4-bromophenyl)-3-sulfobutylbenzoxazolyl, 2-3-dimethyl-5,6-dimethylthiobenzoxazolyl), thiazole nuclei having a C number of 3 to 25 (e.g., 2-3-methylthiazolyl, 2-3-ethylthiazolyl, 2-3-sulfopropylthiazolyl, 2-3-sulfobutylthiazolyl, 2-3,4-dimethylthiazolyl, 2-3,4,4-trimethylthiazolyl, 2-3-carboxyethylthiazolyl, 2-3-methylbenzothiazolyl, 2-3-ethylbenzothiazolyl, 2-3-butylbenzothiazolyl, 2-3-sulfopropylbenzothiazolyl, 2-3-sulfobutylbenzothiazolyl, 2-3-methyl-β-naphthothiazolyl, 2-3-sulfopropyl-γ-naphthothiazolyl, 2-3-(1-naphthoxyethyl)benzothiazolyl, 2-3,5-dimethylbenzothiazolyl, 2-6-chloro-3-methylbenzothiazolyl, 2-6-iodo-3-methylbenzothiazolyl, 2-5-bromo-3-methylbenzothiazolyl, 2-3-ethyl-5-methoxybenzothiazolyl, 2-5-phenyl-3-sulfopropylbenzothiazolyl, 2-5-(4-bromophenyl)-3-sulfobutylbenzothiazolyl, 2-3-dimethyl-5,6-dimethylthiobenzothiazolyl), imidazole nuclei having a C number of 3 to 25 (e.g., 2-1,3-diethylimidazolyl, 2-1,3-dimethylimidazolyl, 2-1-methylbenzimidazolyl, 2-1,3,4-triethylimidazolyl, 2-1,3-diethylbenzimidazolyl, 2-1,3,5-trimethylbenzimidazolyl, 2-6-chloro-1,3-dimethylbenzimidazolyl, 2-5,6-dichloro-1,3-diethylbenzimidazolyl, 2-1,3-disulfopropyl-5-cyano-6-chlorobenzimidazolyl), indolenine nuclei having a carbon number of 10 to 30 carbon atoms (e.g., 3,3-dimethylindolenine), quinoline nuclei having a C number of 9 to 25 (e.g., 2-1-methylquinolyl, 2-1-ethylquinolyl, 2-1-methyl-6-chloroquinolyl, 2-1,3-diethylquinolyl, 2-1-methyl-6-methylthioquinolyl, 2-1-sulfopropylquinolyl, 4-1-methylquinolyl, 4-1-sulfoethylquinolyl, 4-1-methyl-7-chloroquinolyl, 4-1,8-diethylquinolyl, 4-1-methyl-6-methylthioquinolyl, 4-1-sulfopropylquinolyl), selenazole nuclei having a C number of 3 to 25 (e.g., 2-3-methylbenzoselenazolyl), pyridine nuclei having a C number of 5 to 25 (e.g., 2-pyridyl), thiazoline nuclei, oxazoline nuclei, selenazoline nuclei, tetrazoline nuclei, tetrazole nuclei, benzotellurazole nuclei, imidazoline nuclei, imidazo[4,5-quinoxaline] nuclei, oxadiazole nuclei, thiadiazole nuclei, tetrazole nuclei and pyrimidine nuclei.

The heterocyclic ring may be substituted and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino; anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenylcarbamoyl), an acylamino group (preferably having a C number of 1 to 20, e.g., acetylamino, benzoylamino), an imino group (preferably having a C number of 2 to 20, e.g., phthalylimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenylcarbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

The heterocyclic ring may also be condensed with another ring. Preferred examples of the ring with which the heterocyclic ring is condensed include a benzene ring, a benzofuran ring, a pyridine ring, a pyrrole ring, an indole ring and a thiophene ring.

The 5- or 6-membered nitrogen-containing heterocyclic ring formed by $Za_3$ is more preferably an oxazole nucleus, an imidazole nucleus, a thiazole nucleus or an indolenine ring, still more preferably an oxazole nucleus, a thiazole ring or an indolenine ring.

$Za_4$ represents an atomic group for forming a 5- or 6-membered ring. The ring formed by $Za_4$ is a moiety generally called an acidic nucleus which is defined in James (compiler), *The Theory of the Photographic Process,* 4th ed., page 198, Macmillan (1977). The ring formed by $Za_4$ is preferably a nucleus such as 2-pyrazolon-5-one, pyrazolidine-3,5-dione, imidazolin-5-one, hydantoin, 2- or 4-thiohydantoin, 2-iminooxazolidin-4-one, 2-oxazolin-5-one, 2-thiooxazoline-2,4-dione, isorhodanine, rhodanine, indane-1,3-dione, thiophen-3-one, thiophen-3-one-1,1-dioxide, indolin-2-one, indolin-3-one, 2-oxoindazolium, 5,7-dioxo-6,7-dihydrothiazolo[3,2-a]pyrimidine, 3,4-dihydroisoquinolin-4-one, 1,3-dioxane-4,6-dione, barbituric acid, 2-thiobarbituric acid, coumarin-2,4-dione, indazolin-2-one, pyrido[1,2-a]pyrimidine-1,3-dione, pyrazolo[1,5-b]quinazolone or pyrazolopyridone.

The ring formed by $Za_4$ is more preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, still more preferably pyrazolidine-3,5-dione, indane-1,3-dione, 1,3-dioxane-4,6-dione, barbituric acid or 2-thiobarbituric acid, yet still more preferably pyrazolidine-3,5-dione, barbituric acid or 2-thiobarbituric acid, and most preferably 2-thiobarbituric acid.

The ring formed by $Za_4$ may be substituted (preferred examples of the substituent are the same as examples of the substituent on $Za_3$) and the substituent is preferably an alkyl group, an aryl group, a heterocyclic group, a halogen atom a cyano group, a carboxyl group, a sulfo group, an alkoxy group, a sulfamoyl group, a carbamoyl group or an alkoxycarbonyl group.

The heterocyclic ring may also be condensed with another ring. Preferred examples of the ring with which the heterocyclic ring is condensed include a benzene ring, a benzofuran ring, a pyridine ring, a pyrrole ring, an indole ring and a thiophene ring.

Each $Ra_3$ independently represents a hydrogen atom, an alkyl group (preferably having a C number of 1 to 20, e.g., methyl, ethyl, n-propyl, isopropyl, n-butyl, n-pentyl, benzyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl) or a heterocyclic group (preferably having a C number of 1 to 20, e.g., pyridyl, thienyl, furyl, thiazolyl, imidazolyl, pyrazolyl, pyrrolidino, piperidino, morpholino), preferably an alkyl group (preferably an alkyl group having a C number of 1 to 6) or a sulfoalkyl group (preferably 3-sulfopropyl, 4-sulfobutyl, 3-methyl-3-sulfopropyl or 2'-sulfobenzyl).

$Ma_8$ to $Ma_{11}$ each represents a methine group and may have a substituent (preferred examples of the substituent are the same as examples of the substituent on $Za_1$ and $Za_2$). The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group.

$Ma_8$ to $Ma_{11}$ each is preferably an unsubstituted methine group or an alkyl group (preferably having a C number of 1 to 6)-substituted methine group, more preferably an unsubstituted methine group, an ethyl groupsubstituted methine group or a methyl group-substituted methine group.

$Ma_8$ to $Ma_{11}$ may combine with each other to form a ring and preferred examples of the ring formed include a cyclohexene ring, a cyclopentene ring, a benzene ring and a thiophene ring.

$na^3$ is 0 or 1, preferably 0.

$ka^3$ represents an integer of 0 to 8, preferably 0 to 4, more preferably 1 to 3.

When $ka^3$ is 2 or more, multiple $Ma_{10}$s may be the same or different and multiple $Ma_{11}$s may be the same or different.

CI represents an ion for neutralizing the electric charge and y represents a number necessary for the neutralization of electric charge.

The merocyanine dye of undergoing non-resonant two-photon absorption for use in the present invention, represented by formula (2), is more preferably represented by formula (5).

In formula (2), $Ma_{10}$, $Ma_{11}$, $Ra_3$, $Za_4$, $ka^3$, CI and y have the same meanings as in formula (1).

In formula (2), $X_1$ represents —O—, —S—, —NR$_3$— or —CR$_4$R$_5$—, and $R_3$, $R_4$ and $R_5$ each independently represents a hydrogen atom, an alkyl group, an alkenyl group, an aryl group or a heterocyclic group (respective preferred examples are the same as those described for $Ra_3$), preferably an alkyl group.

$X_1$ is preferably —O—, —S— or —CR$_4$R$_5$—.

$R_1$ represents a substituent (preferred examples of the substituent are the same as examples of the substituent on $Za_3$), preferably an alkyl group, an aryl group, a heterocyclic group, a halogen atom, a cyano group, a carboxyl group, a sulfo group, an alkoxy group, a sulfamoyl group, a carbamoyl group or an alkoxycarbonyl group.

a1 represents an integer of 0 to 4, preferably 0 to 2, more preferably 0 or 1.

When a1 is 2 or more, multiple $R_1$s may be the same or different and may combine with each other to form a ring. Preferred examples of the ring formed include a benzene ring, a benzofuran ring, a pyridine ring, a pyrrole ring, an indole ring and a thiophene ring.

The oxonol dye of undergoing non-resonant two-photon absorption for use in the present invention is preferably an oxonol dye represented by formula (3).

In formula (I), $Za_5$ and $Za_6$ each represents an atomic group for forming a 5- or 6-membered ring. The ring formed by $Za_5$ and $Za_6$ is a moiety generally called an acidic nucleus which is defined in James (compiler), *The Theory of the Photographic Process*, 4th ed., page 198, Macmillan (1977). The ring formed by $Za_5$ and $Za_6$ is preferably a nucleus such as 2-pyrazolon-5-one, pyrazolidine-3,5-dione, imidazolin-5-one, hydantoin, 2- or 4-thiohydantoin, 2-iminooxazolidin-4-one, 2-oxazolin-5-one, 2-thiooxazoline-2,4-dione, isorhodanine, rhodanine, indane-1,3-dione, thiophen-3-one, thiophen-3-one-1,1-dioxide, indolin-2-one, indolin-3-one, 2-oxoindazolium, 5,7-dioxo-6,7-dihydrothiazolo[3,2-a]pyrimidine, 3,4-dihydroisoquinolin-4-one, 1,3-dioxane-4,6-dione, barbituric acid, 2-thiobarbituric acid, coumarin-2,4-dione, indazolin-2-one, pyrido[1,2-a]pyrimidine-1,3-dione, pyrazolo[1,5-b]quinazolone or pyrazolopyridone.

The ring formed by $Za_5$ and $Za_6$ is more preferably 2-pyrazolon-5-one, pyrazolidine-3,5-dione, rhodanine, indane-1,3-dione, thiophen-3-one, thiophen-3-one-1,1-dioxide, 1,3-dioxane-4,6-dione, barbituric acid, 2-thiobarbituric acid or coumarin-2,4-dione, still more preferably barbituric acid or 2-thiobarbituric acid, and most preferably barbituric acid The ring formed by $Za_5$ and $Za_6$ may be substituted and preferred examples of the substituent include an alkyl group (preferably having a C number of 1 to 20, e.g., methyl, ethyl, n-propyl, isopropyl, n-butyl, n-pentyl, benzyl, 3-sulfopropyl, 4-sulfobutyl, carboxymethyl, 5-carboxypentyl), an alkenyl group (preferably having a C number of 2 to 20, e.g., vinyl, allyl, 2-butenyl, 1,3-butadienyl), a cycloalkyl group (preferably having a C number of 3 to 20, e.g., cyclopentyl, cyclohexyl), an aryl group (preferably having a C number of 6 to 20, e.g., phenyl, 2-chlorophenyl, 4-methoxyphenyl, 3-methylphenyl, 1-naphthyl), a heterocyclic group (preferably having a C number of 1 to 20, e.g., pyridyl, thienyl, furyl, thiazolyl, imidazolyl, pyrazolyl, pyrrolidino, piperidino, morpholino), an alkynyl group (preferably having a C number of 2 to 20, e.g., ethynyl, 2-propynyl, 1,3-butadynyl, 2-phenylethynyl), a halogen atom (e.g., F, Cl, Br, I), an amino group (preferably having a C number of 0 to 20, e.g., amino, dimethylamino, diethylamino, dibutylamino, anilino), a cyano group, a nitro group, a hydroxyl group, a mercapto group, a carboxyl group, a sulfo group, a phosphonic acid group, an acyl group (preferably having a C number of 1 to 20, e.g., acetyl, benzoyl, salicyloyl, pivaloyl), an alkoxy group (preferably having a C number of 1 to 20, e.g., methoxy, butoxy, cyclohexyloxy), an aryloxy group (preferably having a C number of 6 to 26, e.g., phenoxy, 1-naphthoxy), an alkylthio group (preferably having a C number of 1 to 20, e.g., methylthio, ethylthio), an arylthio group (preferably having a C number of 6 to 20, e.g., phenylthio, 4-chlorophenylthio), an alkylsulfonyl group (preferably having a C number of 1 to 20, e.g., methanesulfonyl, butanesulfonyl), an arylsulfonyl group (preferably having a C number of 6 to 20, e.g., benzenesulfonyl, paratoluenesulfonyl), a sulfamoyl group (preferably having a C number of 0 to 20, e.g., sulfamoyl, N-methylsulfamoyl, N-phenylsulfamoyl), a carbamoyl group (preferably having a C number of 1 to 20, e.g., carbamoyl, N-methylcarbamoyl, N,N-dimethylcarbamoyl, N-phenylcarbamoyl), an acylamino group (preferably having a C number of 1 to 20, e.g., acetylamino, benzoylamino), an imino group (preferably having a C number of 2 to 20, e.g., phthalylimino), an acyloxy group (preferably having a C number of 1 to 20, e.g., acetyloxy, benzoyloxy), an alkoxycarbonyl group (preferably having a C number of 2 to 20, e.g., methoxycarbonyl, phenoxycarbonyl) and a carbamoylamino group (preferably having a C number of 1 to 20, e.g., carbamoylamino, N-methylcarbamoylamino, N-phenylcarbamoylamino). Among these, more preferred are an alkyl group, an aryl group, a heterocyclic group, a halogen atom, a cyano group, a carboxyl group, a sulfo group, an alkoxy group, a sulfamoyl group, a carbamoyl group and an alkoxycarbonyl group.

The heterocyclic ring may also be condensed with another ring. Preferred examples of the ring with which the heterocyclic ring is condensed include a benzene ring, a benzofuran ring, a pyridine ring, a pyrrole ring, an indole ring and a thiophene ring.

$Ma_{12}$ to $Ma_{14}$ each represents a methine group and may have a substituent (preferred examples of the substituent are the same as examples of the substituent on $Za_5$ and $Za_6$) The substituent is preferably an alkyl group, a halogen atom, a nitro group, an alkoxy group, an aryl group, a nitro group, a heterocyclic group, an aryloxy group, an acylamino group, a carbamoyl group, a sulfo group, a hydroxy group, a carboxy group, an alkylthio group or a cyano group, more preferably an alkyl group, a halogen atom, an alkoxy group, an aryl group, a heterocyclic group, a carbamoyl group or a carboxy group, still more preferably an alkyl group, an aryl group or a heterocyclic group.

$Ma_{12}$ to $Ma_{14}$ each is preferably an unsubstituted methine group.

$Ma_{12}$ to $Ma_{14}$ may combine with each other to form a ring and preferred examples of the ring formed include a cyclohexene ring, a cyclopentene ring, a benzene ring and a thiophene ring.

$ka^3$ represents an integer of 0 to 3, preferably 0 to 2, more preferably 1 or 2.

When $ka^1$ is 2 or more, multiple $Ma_{12}$s may be the same or different and multiple $Ma_{13}$s may be the same or different.

CI represents an ion for neutralizing the electric charge and y represents a number necessary for the neutralization of electric charge.

The oxonol dye of undergoing non-resonant two-photon absorption for use in the present invention, represented by formula (3), is more preferably represented by formula (6).

In formula (2), $Ma_{12}$ to $Ma_{14}$, $ka^1$, CI and y have the same meanings as in formula (1).

$X_{11}$ and $X_{12}$ each independently represents O or S and $X_{11}$ and $X_{12}$ both are preferably O.

$R_{11}$ to $R_{14}$ each independently represents a hydrogen atom, an alkyl group (preferably having a carbon atom number (hereinafter referred to as "a C number") of 1 to 20, e.g., methyl, ethyl, n-propyl, isopropyl, n-butyl, n-pentyl, benzyl, 2-sulfopropyl, 3-sulfopropyl, 4-sulfobutyl, 3-methyl-3-sulfopropyl, 2'-sulfobenzyl, carboxymethyl, 5-carboxypentyl), an alkenyl group (preferably having a C number of 2 to 20, e.g., vinyl, allyl), an aryl group (preferably having a C number of 6 to 20, e.g., phenyl, 2-chlorophenyl, 4-methoxyphenyl, 3-methylphenyl, 1-naphthyl, 4-carboxyphenyl, 2-sulfophenyl, 4-sulfophenyl) or a hetero-cyclic group (preferably having a C number of 1 to 20, e.g., pyridyl, thienyl, furyl, thiazolyl, imidazolyl, pyrazolyl, pyrrolidino, piperidino, morpholino), preferably a hydrogen atom, an alkyl group or an aryl group.

$X_{11}$, $R_{11}$ and $R_{12}$ are preferably the same as $X_{12}$, $R_{13}$ and $R_{14}$, respectively.

The methine dye for use in the present invention may be used in the monomer state or in the aggregated state.

Incidentally, the state where dye chromophores are fixed to give a specific spatial disposition by a bonding force such as covalent bonding, coordinate bonding or various intermolecular forces (e.g., hydrogen bonding, van der Waals force, Coulomb force) is generally called an associated (or aggregated) state.

For reference, the aggregate is described below. The aggregate is described in detail, for example, in James (compiler), *The Theory of the Photographic Process*, 4th ed., Chap. 8, pp. 218-222, Macmillan (1977), and Takayoshi Kobayashi, *J-Aggregates*, World Scientific Publishing Co. Pte. Ltd. (1996).

The monomer means a one-molecule form. From the standpoint of absorption wavelength of the aggregate, an aggregate where the absorption shifts to the shorter wavelength with respect to the monomer absorption is called an H-aggregate (a two-molecule form is specially called a dimer), and an aggregate where the absorption shifts to the longer wavelength is called a J-aggregate.

From the standpoint of structure of the aggregate, in the case of a brickwork aggregate, an aggregate small in the shear angle is called a J-aggregate and an aggregate large in the shear angle is called an H-aggregate. The brickwork aggregate is described in detail in *Chemical Physics Letters*, Vol. 6, page 183 (1970). As an aggregate having a similar structure to the brickwork aggregate, an aggregate having a ladder or staircase structure is known. The aggregate having a ladder or staircase structure is described in detail in *Zeitschrift fur Physikalische Chemie*, Vol. 49, page 324 (1941).

Also, as an aggregate of forming a structure other than the brickwork structure, an aggregate taking a herringbone structure is known (this aggregate can be called a herringbone aggregate).

The herringbone aggregate is described in Charles Reich, *Photographic Science and Engineering*, Vol. 18, No. 3, page 335 (1974). The herringbone aggregate has two absorption maximums attributed to the aggregate.

As described above, whether the dye is taking an aggregated state can be confirmed by the change in the absorption (absorption $\lambda$max, $\epsilon$, absorption form) from the monomer state.

Whichever system, solution system or film system, is used for the compound of the present invention, when the absorption is changed from the absorption in the monomer state of a dilute solution, this can be defined as an intermolecular aggregation state.

The compound for use in the present invention may be shifted to shorter wavelength (H-aggregate), longer wavelength (J-aggregate) or both regions, but J-aggregate is preferred.

The intermolecular aggregation state of a compound can be formed by various methods.

For example, in the case of a solution system, a method of dissolving the compound in an aqueous solution having added thereto a matrix such as gelatin (for example, an aqueous 0.5 wt % gelatin•$10^{-4}$ M compound solution) or in an aqueous solution having added thereto a salt such as KCl (for example, an aqueous 5% KCl•$2\times10^{-3}$ M compound solution), or a method of adding the compound in a good solvent and then adding thereto a bad solvent (for example, DMF-water system or chloroform-toluene system) may be used.

In the case of a film system, methods such as polymer dispersion system, amorphous system, crystal system and LB film system may be used.

Furthermore, the intermolecular aggregation state may also be formed by the adsorption, chemical bonding or self-organization to a bulk or fine particle (from μm to nm size) semiconductor (for example, silver halide or titanium oxide) or to a bulk or fine particle metal (for example, gold, silver or platinum). The spectral sensitization by the J-aggregation adsorption of cyanine dye on a silver halide crystal performed in the field of silver salt color photography utilizes this technique.

As for the number of compounds participating in the intermolecular aggregation, two compounds may be used or a very large number of compounds may be used.

Specific preferred examples of the methine dye of undergoing non-resonant two-photon absorption for use in the present invention are set forth below, however, the present invention is not limited thereto.

| | $R_{51}$ | Cl |
|---|---|---|
| D-1 | $-(CH_2)_3-SO_3^-$ | $Na^+$ |
| D-2 | $-(CH_2)_2-SO_3^-$ | $C_2H_5-N^+\text{(pyridine)}$ |
| D-3 | $-C_2H_5$ | $I^-$ |
| D-4 | $-(CH_2)_3-N^+(CH_3)_3$ | $(Br^-)_3$ |

| | $R_{51}$ | $R_{52}$ | Cl |
|---|---|---|---|
| D-5 | $-(CH_2)_3-SO_3^-$ | $-Cl$ | $Na^+$ |
| D-6 | $-C_2H_5$ | " | $Br^-$ |
| D-7 | $-(CH_2)_4-SO_3^-$ | $-C_6H_4-Br$ | $HN^+(C_2H_5)_3$ |
| D-8 | $-(CH_2)_3-SO_3^-$ | $-COOH$ | $K^+$ |
| D-9 | $-CH_3$ | $-SO_3^-$ | $Na^+$ |
| D-10 | $-(CH_2)_3-SO_3^-$ | 2-thienyl | $HN^+\text{(pyridine)}$ |

| | $R_{51}$ | $R_{52}$ | $R_{53}$ | Cl |
|---|---|---|---|---|
| D-11 | $-(CH_2)_4-SO_3^-$ | $-C_6H_5$ | $-H$ | DBU-H$^+$ |
| D-12 | $-C_2H_5$ | " | " | $I^-$ |
| D-13 | $-(CH_2)_3-SO_3^-$ | $-C_6H_5$ | $-C_2H_5$ | $Na^+$ |
| D-14 | $-(CH_2)_3-N^+(CH_3)_3$ | $-Cl$ | $-CH_3$ | $(Br^-)_3$ |
| D-15 | $-(CH_2)_3-SO_3^-$ | $-H$ | $-H$ | $K^+$ |
| D-16 | $-C_2H_5$ | $-CH_3$ | $-C_2H_5$ | $I^-$ |
| D-17 | $-(CH_2)_4-SO_3^-$ | $-OCH_3$ | $-H$ | $HN^+\text{(pyridine)}$ |

-continued
D-18 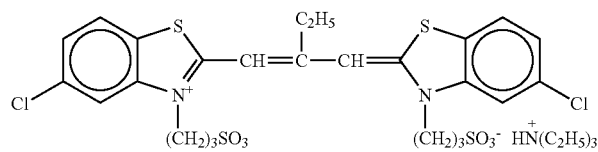
D-19 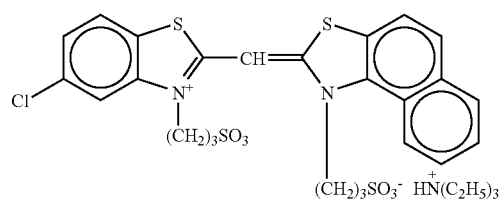
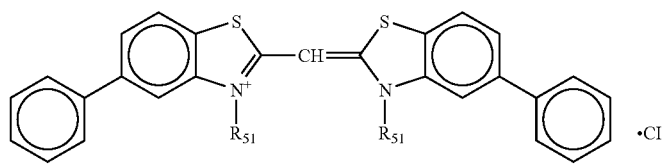
| | $R_{51}$ | Cl |
|---|---|---|
| D-20 | $-(CH_2)_3-SO_3^-$ | $HN^+(C_2H_5)_3$ |
| D-21 | $-C_2H_5$ | 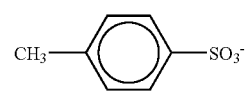 |
| D-22 | 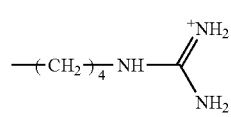 | $(Br^-)_3$ |
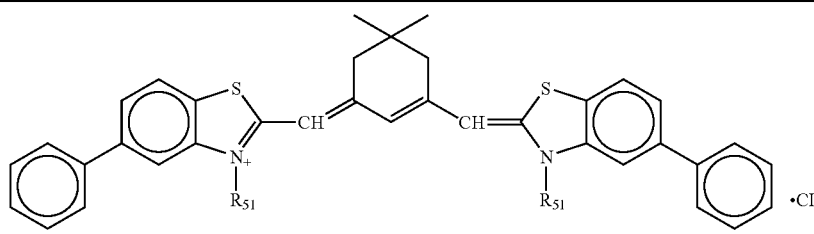
| | $R_{51}$ | Cl |
|---|---|---|
| D-23 | $-(CH_2)_3-SO_3^-$ | $Na^+$ |
| D-24 | $-CH_3$ | $I^-$ |
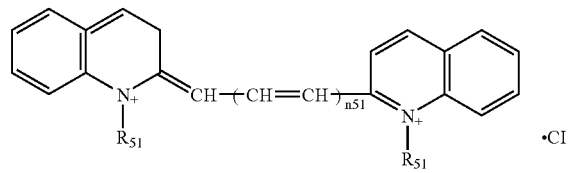
| | $R_{51}$ | $n_{51}$ | Cl |
|---|---|---|---|
| D-25 | $-(CH_2)_3-SO_3^-$ | 0 | $Na^+$ |
| D-26 | $-C_2H_5$ | 1 |  |
| D-27 | $-(CH_2)_3-SO_3^-$ | 1 | $K^+$ |
| D-28 | " | 2 | $Na^+$ |

-continued
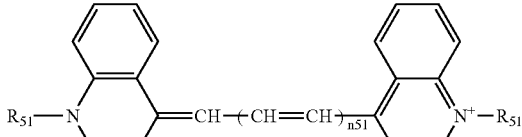
| | $R_{51}$ | $n_{51}$ | |
|---|---|---|---|
| D-29 | –(CH$_2$)$_3$–SO$_3^-$ | 0 | Na$^+$ |
| D-30 | " | 1 | " |
| D-31 | –C$_2$H$_5$ | " |  |
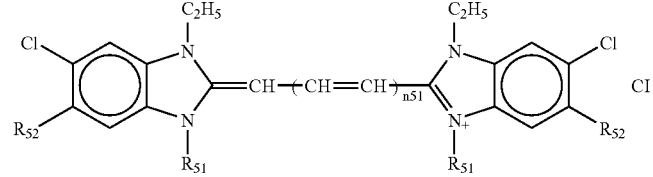
| | $R_{51}$ | $R_{52}$ | $n_{51}$ | Cl |
|---|---|---|---|---|
| D-32 | –(CH$_2$)$_3$–SO$_3^-$ | –Cl | 0 | Na$^+$ |
| D-33 | " | " | 1 | " |
| D-34 | –C$_2$H$_5$ | " | " | I$^-$ |
| D-35 | –(CH$_2$)$_4$–SO$_3^-$ | –CN | " | HN$^+$(C$_2$H$_5$)$_3$ |
| D-36 | " | –CF$_3$ | " | K$^+$ |
| D-37 | " | –Cl | 2 | 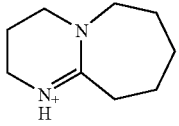 |
| D-38 | " | –CF$_3$ | " | K$^+$ |
| D-39 | –(CH$_2$)$_3$–SO$_3^-$ | –CN | " | 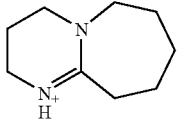 |
| D-40 | –C$_2$H$_5$ | " | " | I$^-$ |
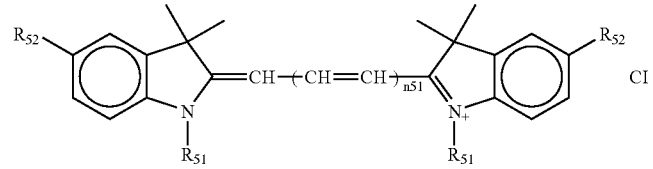
| | $R_{51}$ | $R_{52}$ | $n_{51}$ | Cl |
|---|---|---|---|---|
| D-41 | –(CH$_2$)$_3$–SO$_3^-$ | –H | 0 | Na$^+$ |
| D-42 | " | " | 1 |  |
| D-43 | –C$_4$H$_9$ | –COOH | " |  |
| D-44 | –CH$_3$ | –CONH$_2$ | " | " |
| D-45 | –CH$_3$ | –SO$_3^-$ | " | K$^+$ |

-continued
| | | | | |
|---|---|---|---|---|
| D-46 | -(CH₂)₄-SO₃⁻ | —H | 2 | " |
| D-47 | -(CH₂)₃-SO₃⁻ | —COOH | " | " |
| D-48 | —CH₃ | —CH₃ | " |  |
| D-49 | " | —Cl | " | " |
| D-50 | " | —CN | " | " |
D-51 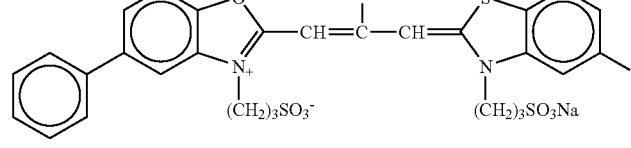
D-52 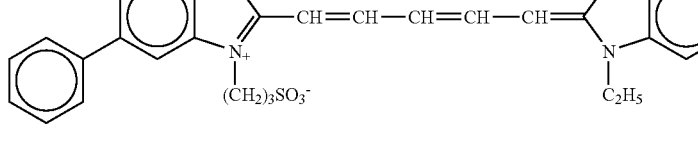
D-53 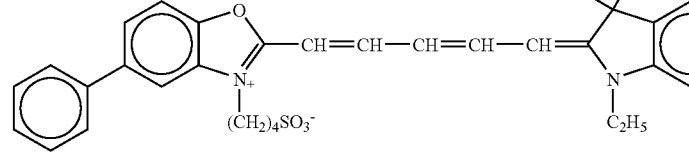
D-54 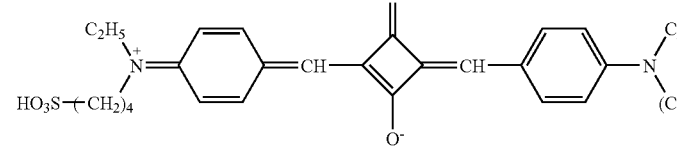
D-55 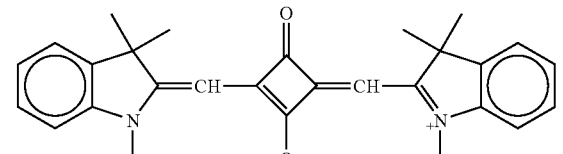
D-56 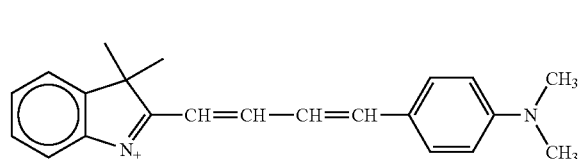

-continued
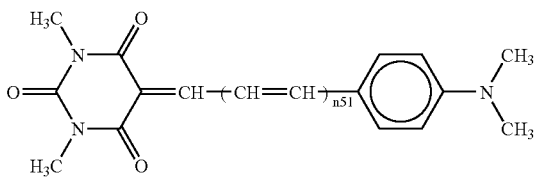
| | n51 |
|---|---|
| D-57 | 0 |
| D-58 | 1 |
D-59 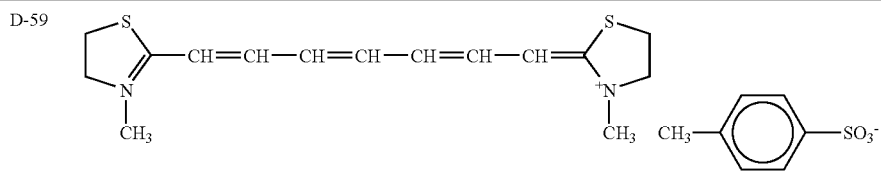
D-60 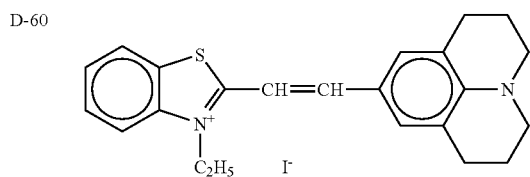
D-61 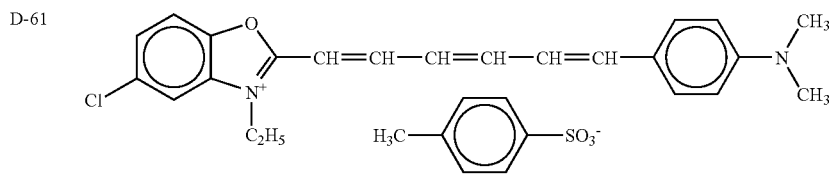
D-62 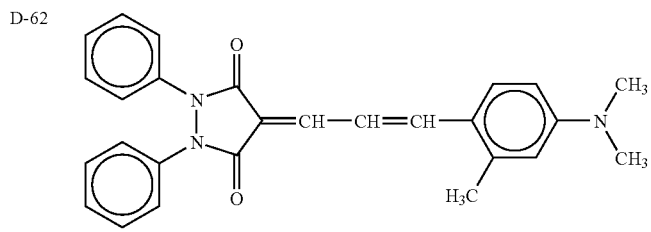
D-63 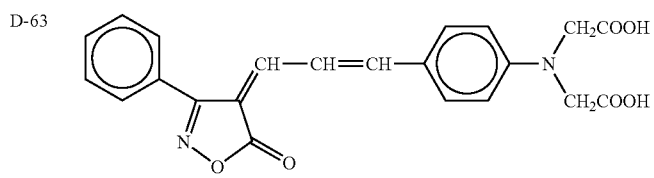
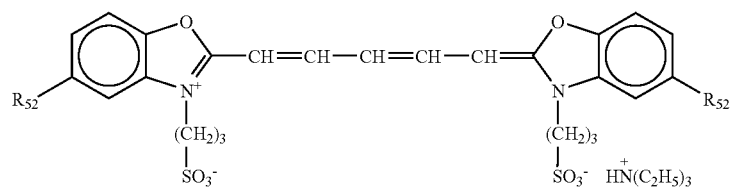
| | $R_{52}$ |
|---|---|
| D-64 | —F |
| D-65 | —Cl |
| D-66 | —Br |
| D-67 | —I |

| | -continued | |
|---|---|---|
| D-68 | | 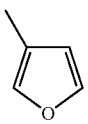 |
| D-69 | | 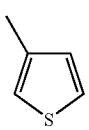 |
| D-70 | | 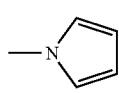 |
D-71 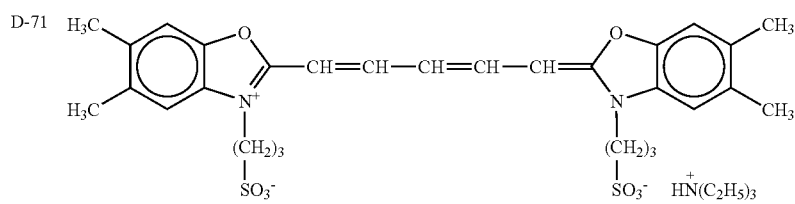
D-72 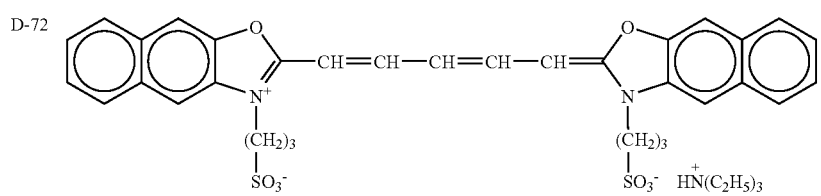
D-73 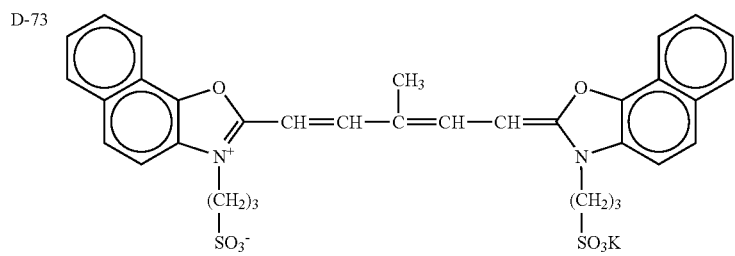
D-74 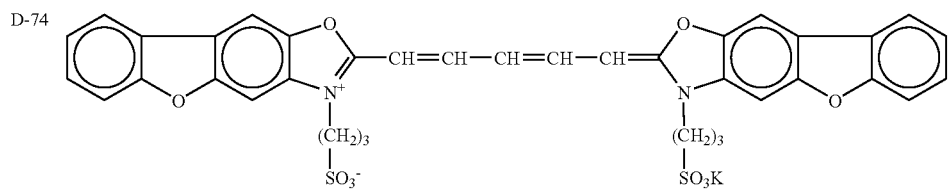
D-75 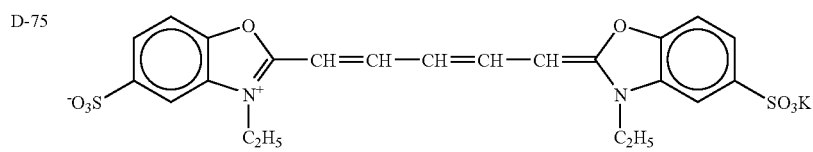
D-76 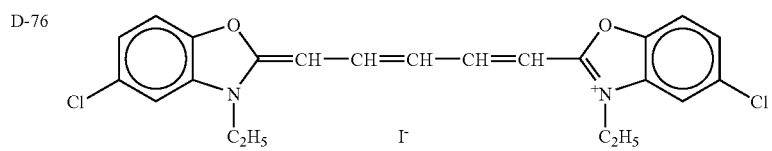

D-77
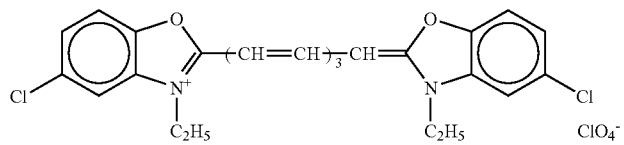
D-78
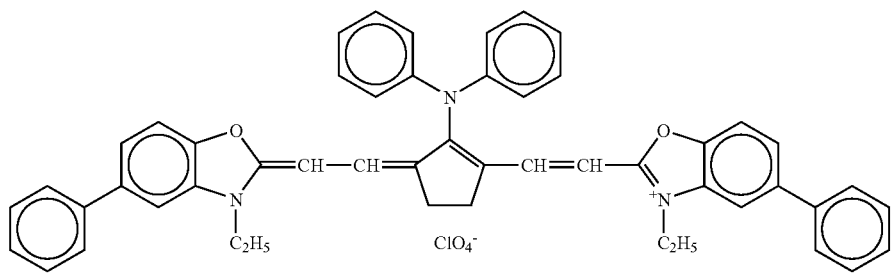
D-79
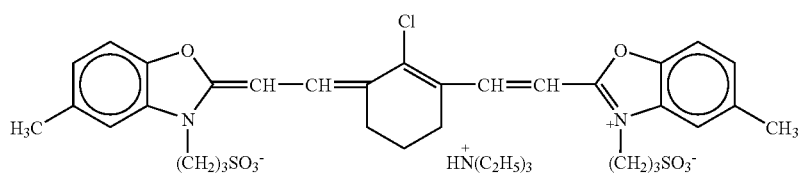
D-80
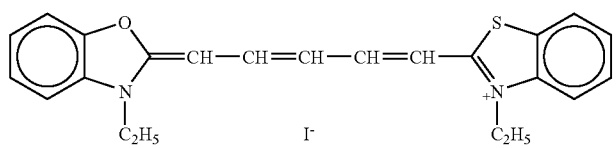
D-81
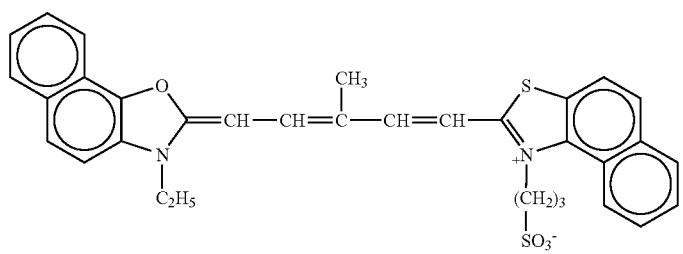
D-82
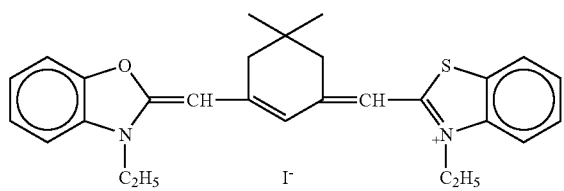
D-83
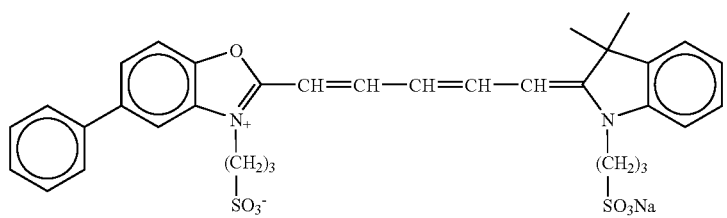

-continued
D-84
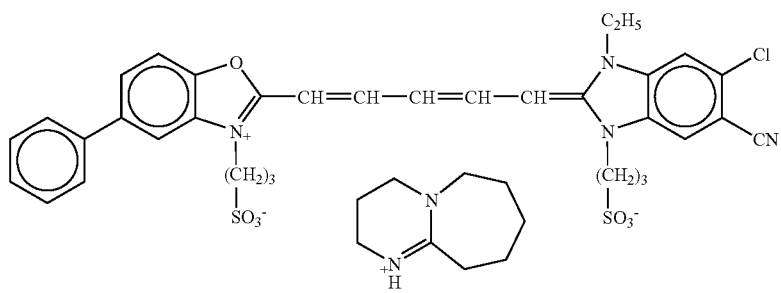
D-85
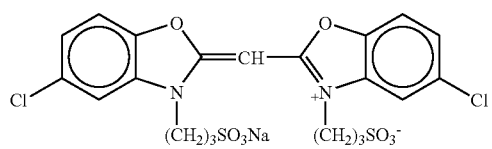
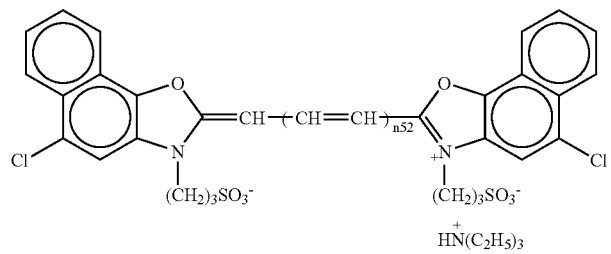
n52
| | |
|---|---|
| D-86 | 1 |
| D-87 | 2 |
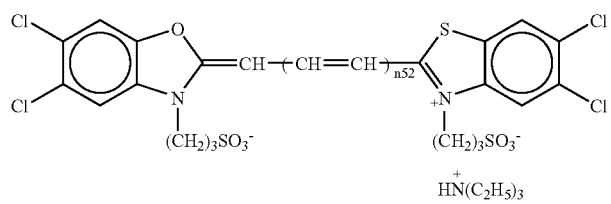
n52
| | |
|---|---|
| D-88 | 1 |
| D-89 | 2 |
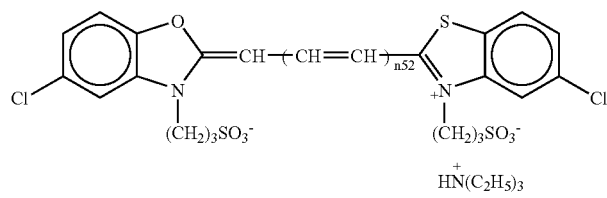
n52
| | |
|---|---|
| D-90 | 1 |
| D-91 | 2 |

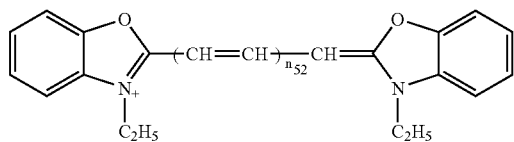
| | n52 |
|---|---|
| D-92 | 1 |
| D-93 | 2 |
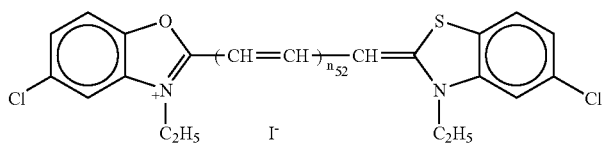
| | n52 |
|---|---|
| D-94 | 1 |
| D-95 | 2 |
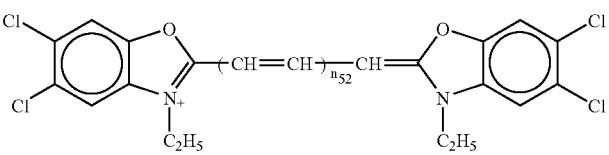
| | n52 |
|---|---|
| D-96 | 1 |
| D-97 | 2 |
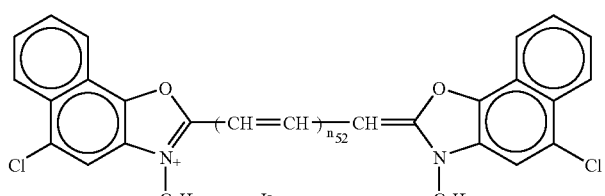
| | n52 |
|---|---|
| D-98 | 1 |
| D-99 | 2 |
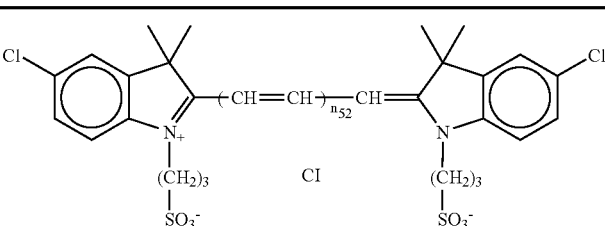
| | n51 | Cl |
|---|---|---|
| D-100 | 1 | 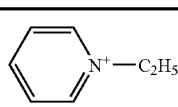 |
| D-101 | 2 | Na$^+$ |

-continued

D-102: [Structure: 5,6-dimethylbenzoxazole-N(CH3)+ linked by —CH=CH—CH=CH—CH= to 5,6-dimethylbenzoxazole-N(CH3), with CH3-C6H4-SO3− counterion]

D-103: [Structure: 5-bromobenzoxazole-N(C4H9)+ linked by —CH=CH—CH=CH—CH= to 5-bromobenzoxazole-N(C4H9), with Br− counterion]

[General structure: barbituric acid derivative with R51, R52 on nitrogens, connected by (CH=CH)n51 to benzazole ring with X51, N-R53, and R54 substituent]

| | $R_{51}$ | $R_{52}$ | $R_{53}$ | $R_{54}$ | $X_{51}$ | $n_{51}$ |
|---|---|---|---|---|---|---|
| D-104 | —CH3 | —CH3 | —C2H5 | —H | —O— | 2 |
| D-105 | —H | —H | —(CH2)3-SO3Na | —C6H5 | " | 1 |
| D-106 | —C2H5 | —H | —C2H5 | —SO3Na | " | 3 |
| D-107 | —CH3 | —C6H5 | " | —H | " | 4 |
| D-108 | —C4H9 | —CH2COOH | " | " | " | 2 |
| D-109 | —CH3 | —CH3 | " | —C6H5 | —S— | " |
| D-110 | —C4H9 | —C6H4-COOH | —(CH2)3-SO3Na | —H | " | 3 |
| D-111 | —C2H5 | —H | —C2H5 | —H | —NC2H5— | 2 |
| D-112 | —CH3 | —CH3 | —CH3 | —H | —N(CH3)2 | 2 |
| D-113 | —C2H5 | —H | " | " | " | 3 |
| D-114 | —C4H9 | —C6H5 | —(CH2)4-SO3K | " | " | 2 |

D-115: [Structure: barbituric acid with N-(4-KOOC-C6H4) and N-C2H5 substituents, connected by —CH=CH—CH=CH—CH=CH— to 1,1-dimethyl-benz[e]indole with N-(CH2)4SO3K]

-continued
D-116
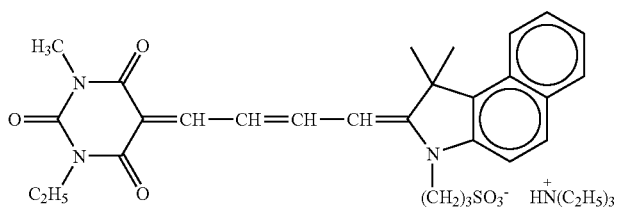
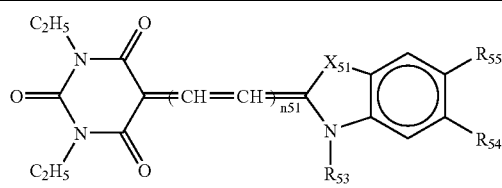
| | $R_{53}$ | $R_{54}$ | $R_{55}$ | $X_{51}$ | $n_{51}$ |
|---|---|---|---|---|---|
| D-117 | —(CH$_2$)$_3$—SO$_3$ HN$^+$(C$_2$H$_5$)$_3$ | —H | —H | —C(CH$_3$)$_2$— | 2 |
| D-118 | —CH$_3$ | " | " | " | 3 |
| D-119 | " | " | " | " | 1 |
| D-120 | " | " | —CONH$_2$ | " | 2 |
| D-121 | —(CH$_2$)$_3$—SO$_3$Na | " | —COOH | " | 3 |
| D-122 | " | —H | —H | —O— | 2 |
| D-123 | " | —Cl | —H | " | 2 |
| D-124 | " | —SO$_3$Na | " | —S— | 3 |
| D-125 | —(CH$_2$)$_4$—SO$_3$Na | —CH$_3$ | —CH$_3$ | " | 2 |
| D-126 | —C$_2$H$_5$ | —Cl | —CN | —NC$_2$H$_5$ | 3 |
| D-127 | —(CH$_2$)$_4$—SO$_3$Na | —Cl | —Cl | —NC$_2$H$_5$ | 2 |
D-128
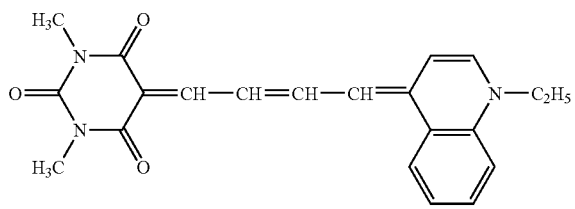
D-129
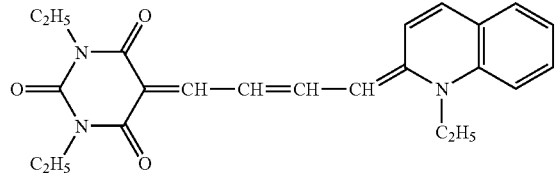
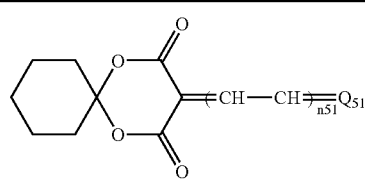
| | $Q_{51}$ | $n_{51}$ |
|---|---|---|
| D-130 | 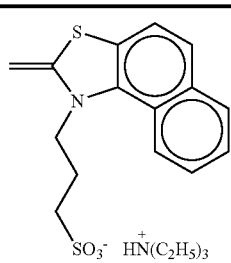 | 2 |

-continued

| D-131 | [structure: 3-ethyl-5-phenyl-2-methylene-benzoxazoline] | 3 |
| D-132 | [structure: 1,3,3-trimethyl-5-methyl-2-methylene-indoline] | 4 |

[structure: C₂H₅O−CO−C(R₅₆)=CH−(CH=CH)ₙ₅₁−[X₅₁/N-CH₃ benzo ring]]

| | $R_{56}$ | $X_{51}$ | $n_{51}$ |
|---|---|---|---|
| D-133 | —CN | —S— | 2 |
| D-134 | —C(=O)—C₆H₅ | —O— | 3 |
| D-135 | —COOC₂H₅ | —C(CH₃)₂— | " |
| D-136 | —SO₂—C₆H₅ | " | 2 |

[structure: Q₅₂=(CH=CH)ₙ₅₁−[3,3-dimethylindoline with N-(CH₂)₃SO₃⁻ · HN⁺(C₂H₅)₃]]

| | $Q_{52}$ | $n_{51}$ |
|---|---|---|
| D-137 | [structure: 2-methylene-1,3-indandione] | 2 |
| D-138 | " | 3 |
| D-139 | [structure: 2-methylene-benzothiophen-3(2H)-one 1,1-dioxide] | 2 |
| D-140 | [structure: 2-methylene-benzothiophen-3(2H)-one] | 3 |

-continued
| | | |
|---|---|---|
| D-141 | 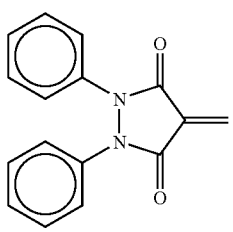 | 2 |
| D-142 | 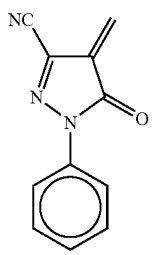 | 2 |
| D-143 | 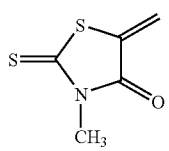 | 2 |
| D-144 | 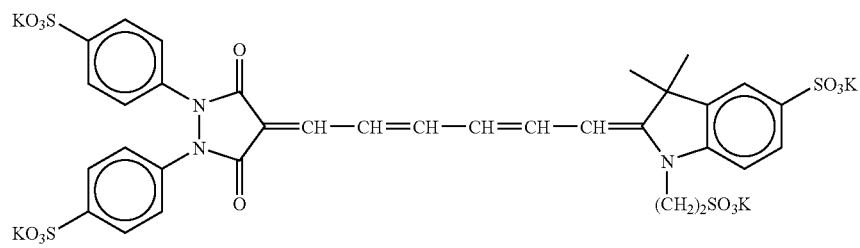 | |
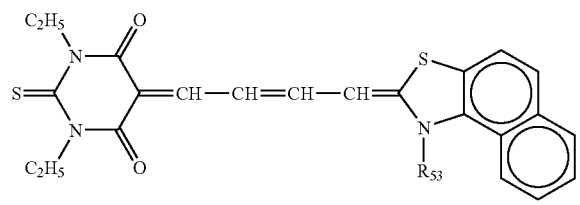
R53
| D-145 | $-(CH_2)_3-SO_3^-HN^+(C_2H_5)_3$ |
| D-146 | $-CH_3$ |
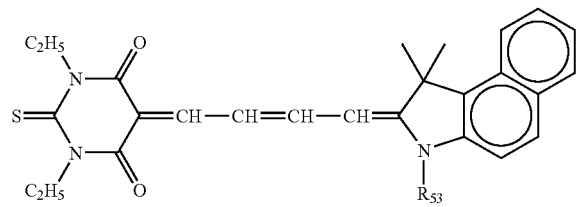
R53
| D-147 | $-(CH_2)_3-SO_3^-HN^+(C_2H_5)_3$ |
| D-148 | $-CH_3$ |

-continued
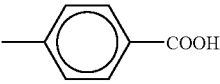
| | R₅₁ | R₅₂ | n₅₁ |
|---|---|---|---|
| D-149 | —CH₃ | —CH₃ | 2 |
| D-150 | —H | —H | " |
| D-151 | —C₂H₅ | —H | " |
| D-152 | —C₄H₉ | 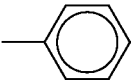 —COOH | " |
| D-153 | —CH₃ | 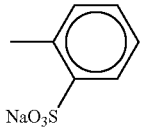 | " |
| D-154 | —C₄H₉ | —CH₂COOH | " |
| D-155 | —CH₃ | —(CH₂)₃—SO₃Na | " |
| D-156 | —CH₂COOH | " | " |
| D-157 | 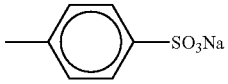 NaO₃S | —CH₃ | " |
| D-158 | 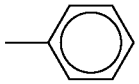—SO₃Na | " | " |
| D-159 | 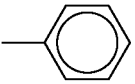 | 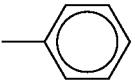 | " |
| D-160 | —CH₃ | —CH₃ | 1 |
| D-161 | " | 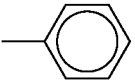 | " |
| D-162 | —H | —H | " |
| D-163 | —CH₃ | —CH₃ | 0 |
| D-164 | —H | 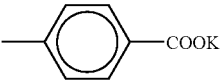 | 2 |
| D-165 | —H | —⟨phenyl⟩—COOK | " |
| | R₅₁ | R₅₂ | n₅₁ | Cl |
|---|---|---|---|---|
| D-166 | —C₂H₅ | —C₂H₅ | 2 | HN⁺(C₂H₅)₃ |
| D-167 | —H | —H | " | H⁺ |

-continued
| | | | | |
|---|---|---|---|---|
| D-168 | —$C_2H_5$ | 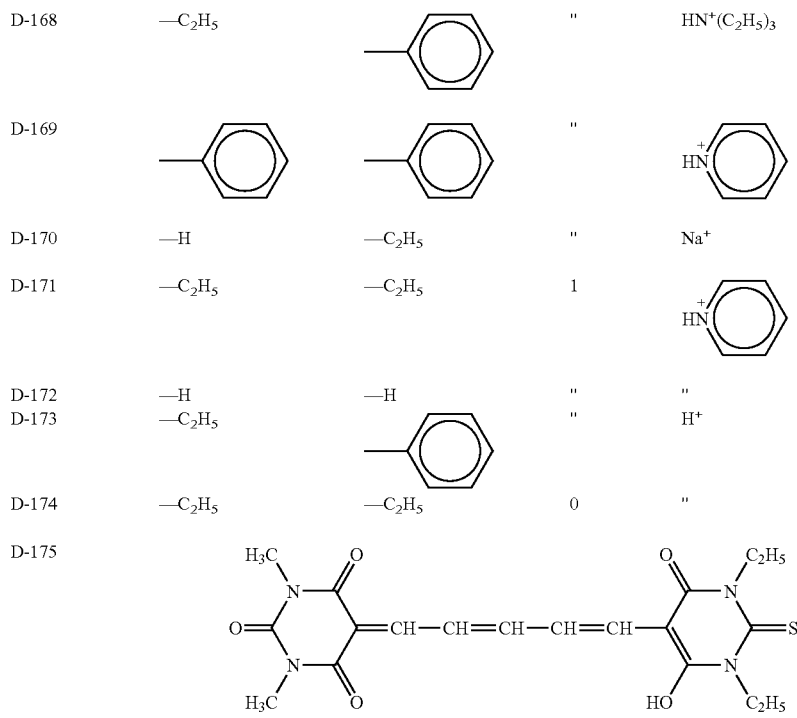 | " | $HN^+(C_2H_5)_3$ |
| D-169 | (tolyl) | (tolyl) | " | (pyridinium) |
| D-170 | —H | —$C_2H_5$ | " | $Na^+$ |
| D-171 | —$C_2H_5$ | —$C_2H_5$ | 1 | (pyridinium) |
| D-172 | —H | —H | " | " |
| D-173 | —$C_2H_5$ | (tolyl) | " | $H^+$ |
| D-174 | —$C_2H_5$ | —$C_2H_5$ | 0 | " |
D-175
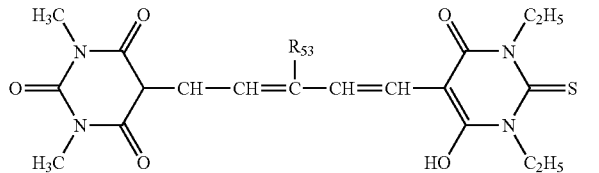
| | $R_{53}$ |
|---|---|
| D-176 | 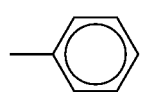 |
| D-177 | —$CH_3$ |
| D-178 | —COOH |
| D-179 | —$COOC_2H_5$ |
| D-180 | —Cl |
| D-181 | —$OCH_3$ |
$Q_{51}$=CH—(CH=CH)$_{\overline{n}51}$ $Q_{51}$
| | $Q_{51}$ | $Q_{52}$ | $n_{51}$ |
|---|---|---|---|
| D-182 | 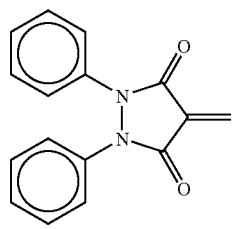 | 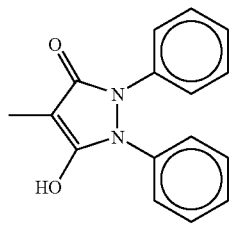 | 2 |
| D-183 | " | " | 1 |

-continued
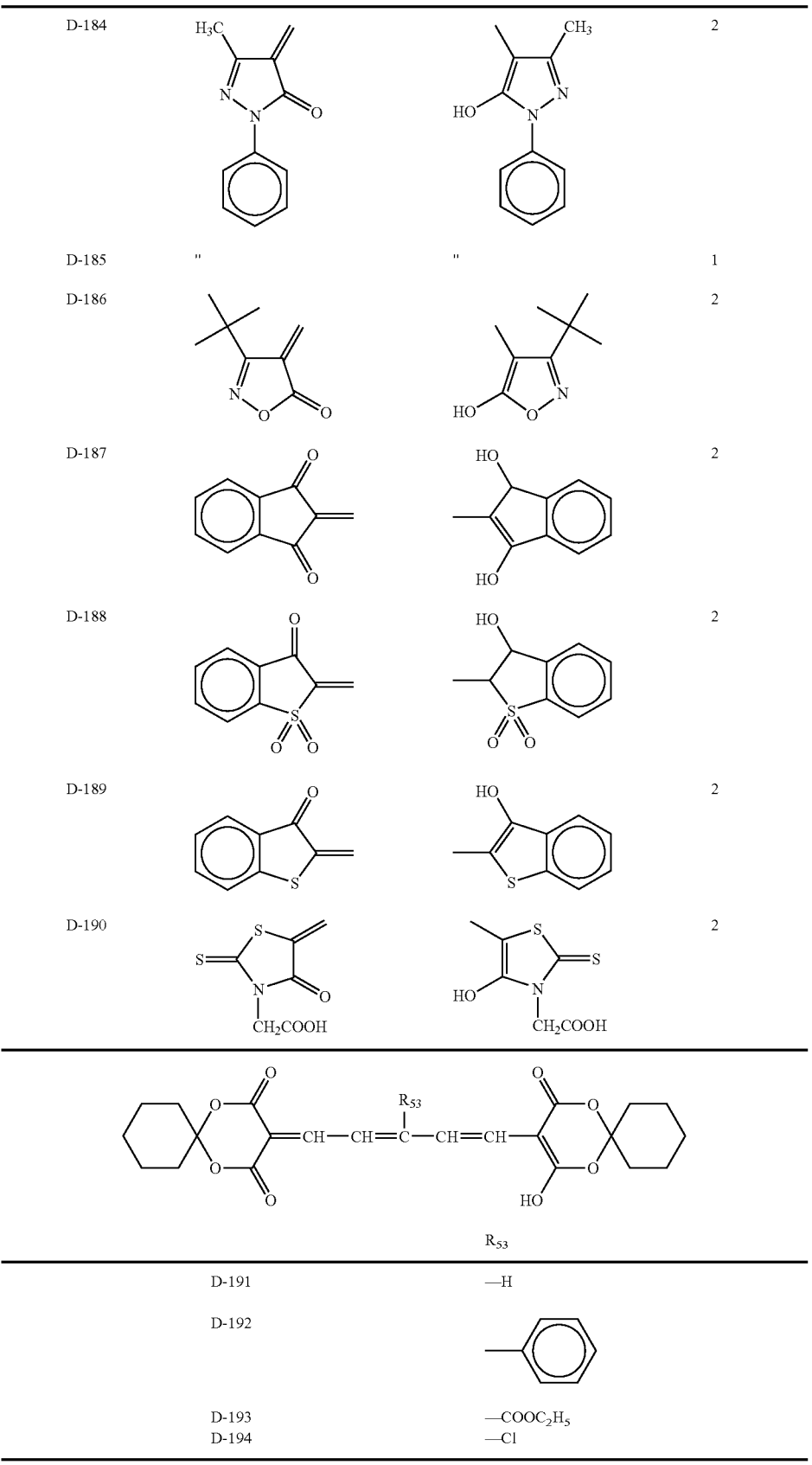

-continued
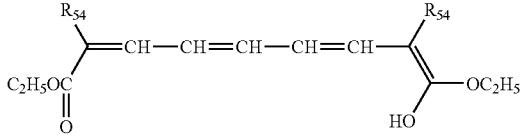
| | $R_{54}$ |
|---|---|
| D-195 | —CN |
| D-196 | 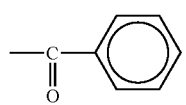 |
| D-197 | —COOC$_2$H$_5$ |
| D-198 | 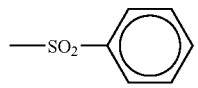 |
D-200
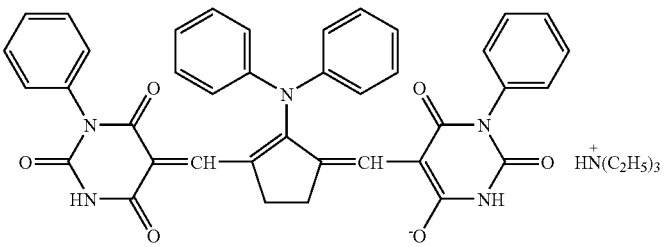
D-201
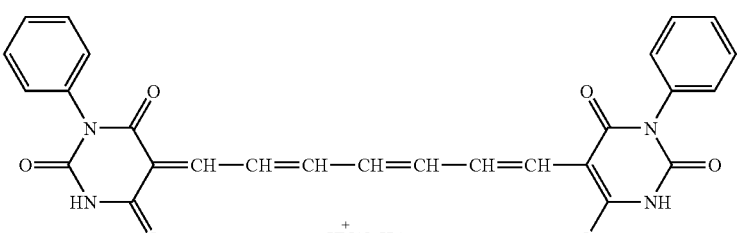
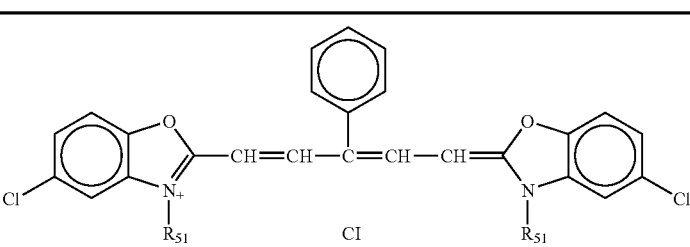
| | R51 | Cl |
|---|---|---|
| D-202 | —C$_2$H$_5$ | I$^-$ |
| D-203 | —(CH$_2$)$_3$-SO$_3^-$ | 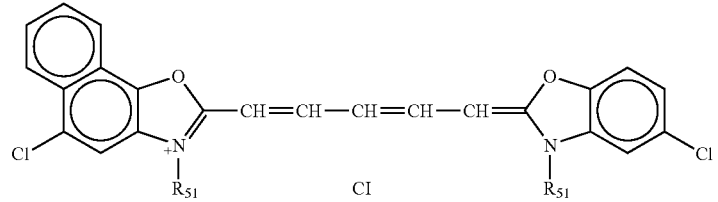 |

-continued

|  | R51 | Cl |
|---|---|---|
| D-204 | —C$_2$H$_5$ | I$^-$ |
| D-205 | –(CH$_2$)$_3$–SO$_3^-$ | HN$^+$(C$_2$H$_5$)$_3$ |

[Structure: benzofuran-benzoxazole pentamethine dye with R$_{51}$ groups and Cl substituent]

|  | R51 | Cl |
|---|---|---|
| D-206 | —C$_2$H$_5$ | I$^-$ |
| D-207 | –(CH$_2$)$_3$–SO$_3^-$ | HN$^+$(C$_2$H$_5$)$_3$ |

[Structure: pyrrolyl-benzoxazole pentamethine dye with R$_{51}$ groups and Cl substituent]

|  | R51 | Cl |
|---|---|---|
| D-206 | —C$_2$H$_5$ | I$^-$ |
| D-207 | –(CH$_2$)$_3$–SO$_3^-$ | Na$^+$ |

The compound for use in the present invention is preferably a compound having a two-photon absorbing cross-sectional area δ of 1,000 GM or more, because when used in the material, elevation of sensitivity, improvement of recording speed, reduction in the size of laser at recording can be obtained. The two-photon absorbing cross-sectional area is more preferably 5,000 GM or more, still more preferably 10,000 GM or more, yet still more preferably 30,000 GM or more, and most preferably 60,000 GM or more. The value of the two-photon absorbing cross-sectional area is a value measured in our company according to the measuring method described later in Examples.

The compound for use in the present invention is preferably irradiated with a laser ray having a wavelength longer than the linear absorption band of the compound to induce non-resonant two-photon absorption. In view of recording density on use in a two-photon absorbing (three-dimensional) recording material or the like, the compound is more preferably irradiated with a laser ray having a wavelength longer than the linear absorption band of the compound and present in the range from 400 to 1,000 nm, still more preferably with a laser ray of 400 to 800 nm, to induce non-resonant two-photon absorption.

Also, the compound for use in the present invention preferably induces non-resonant two-photon absorption by the irradiation of a laser ray having a wavelength longer than the linear absorption band of the compound and generates emission from the resulting excited state.

The compound for use in the present invention may undergo non-resonant multi-photon absorption and non-resonant multi-photon emission of three or more photons.

The content of the dye in the two-photon absorbing material is not particularly limited, but may be properly selected from the range of 0.01 to 100% by weight based on the use thereof.

The two-photon absorbing material of the present invention can be applied to optical recording medium, three-dimensional optical recording medium, three-dimensional volume display, three-dimensional stereo-lithography, two-photon contrasting, two-photon photo-dynamic therapy (PDT), up-conversion laser and the like.

EXAMPLES

The present invention is described in greater detail below by referring to Examples, however, the present invention is of course not limited to these Examples.

Example 1

[Synthesis of D-1]

Compound D-1 of the present invention can be synthesized by the following method.

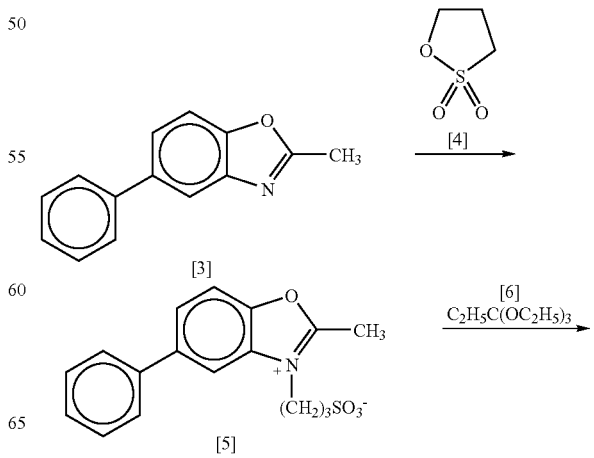

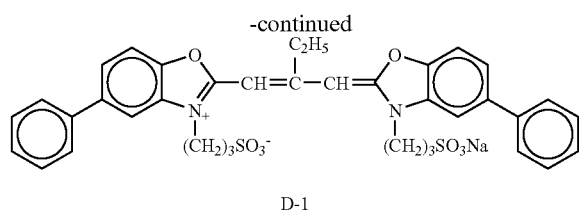

D-1

Benzoxazole [3] (52.25 g (0.2 mol)) and 45.75 g (0.375 mol) of propane sultone [4] were stirred under heating at 140° C. for 4 hours. After cooling, acetone was added and crystals were separated by filtration and washed with acetone to obtain 70.42 g (yield: 85%) of a quaternary salt [5].

The quaternary salt [5] (66.2 g (0.2 mol)), 200 ml of triethyl orthopropionate, 200 ml of pyridine and 80 ml of acetic acid were stirred under heating at 120° C. for 1 hour. After cooling, the reaction solution was washed by decantation three times with ethyl acetate and then dissolved and stirred in 100 ml of methanol. Thereto, a 20 ml methanol solution containing 4.0 g (50 mmol) of sodium acetate was added and crystals produced were separated by filtration. These crystals were further dispersed in methanol and then separated by filtration to

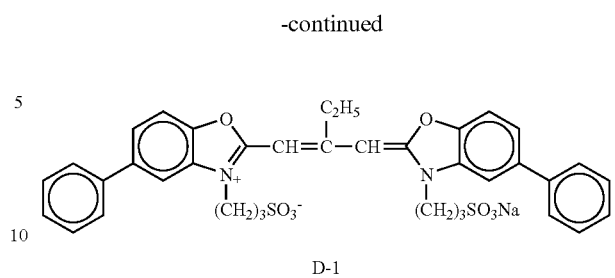

D-1

Benzoxazole [3] (52.25 g (0.2 mol)) and 45.75 g (0.375 mol) of propane sultone [4] were stirred under heating at 140° C. for 4 hours. After cooling, acetone was added and crystals were separated by filtration and washed with acetone to obtain 70.42 g (yield: 85%) of a quaternary salt [5].

The quaternary salt [5] (66.2 g (0.2 mol)), 200 ml of triethyl orthopropionate, 200 ml of pyridine and 80 ml of acetic acid were stirred under heating at 120° C. for 1 hour. After cooling, the reaction solution was washed by decantation three times with ethyl acetate and then dissolved and stirred in 100 ml of methanol. Thereto, a 20 ml methanol solution containing 4.0 g (50 mmol) of sodium acetate was added and crystals produced were separated by filtration. These crystals were further dispersed in methanol and then separated by filtration to obtain 31.36 g (yield: 43.4%) of the objective D-1 as vermilion crystal.

The structure was confirmed by NMR spectrum, MS spectrum and elemental analysis.

[Synthesis of D-117]

Compound D-117 of the present invention can be synthesized by the following method.

Synthesis of D-117

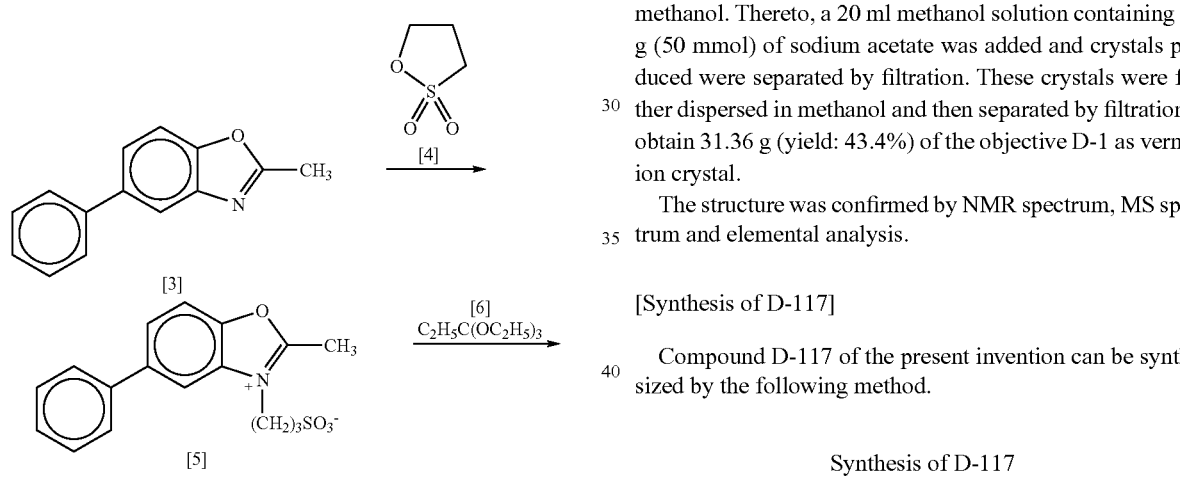

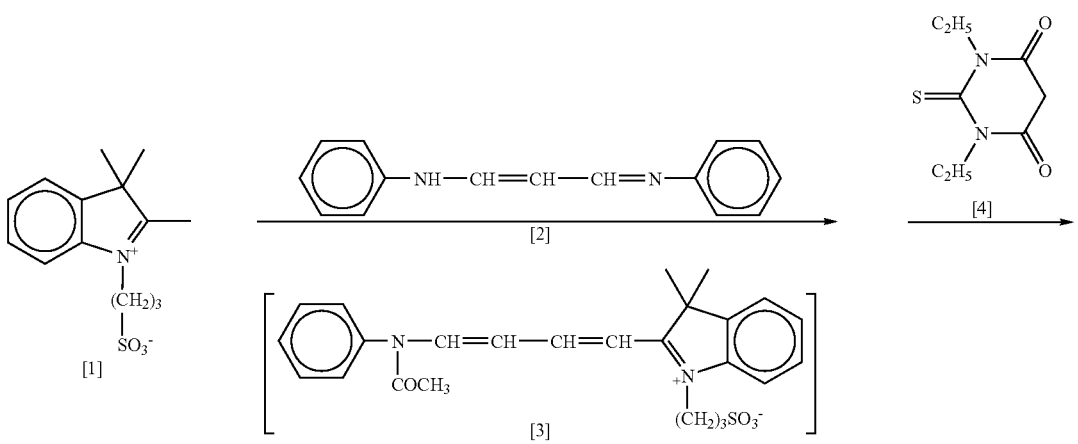

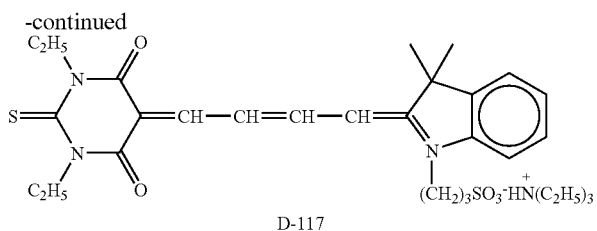

D-117

A quaternary salt [1] (2.81 g (10 mmol)), 6.67 g (30 mmol) of [2], 10 g of acetic anhydride and 50 ml of acetonitrile were refluxed for 30 minutes. After concentration and decantation with ethyl acetate, a crude product of the anil form [3] was obtained.

To the crude product of anil form [3], 2,00 g (10 mmol) of thiobarbituric acid [4], 3.0 g (30 mmol) of triethylamine and 100 ml of ethanol were added and refluxed for 1 hour. The reaction solution was concentrated, purified by silica gel column chromatography (developer solvent: chloroform:methanol=20:1→10:1) and recrystallized with methanol-isopropyl alcohol to obtain 2.55 g (total yield: 41.3%) of the objective D-117 crystal.

The structure was confirmed by NMR spectrum, MS spectrum and elemental analysis.

[Synthesis of D-149]

Compound D-149 of the present invention can be synthesized by the following method.

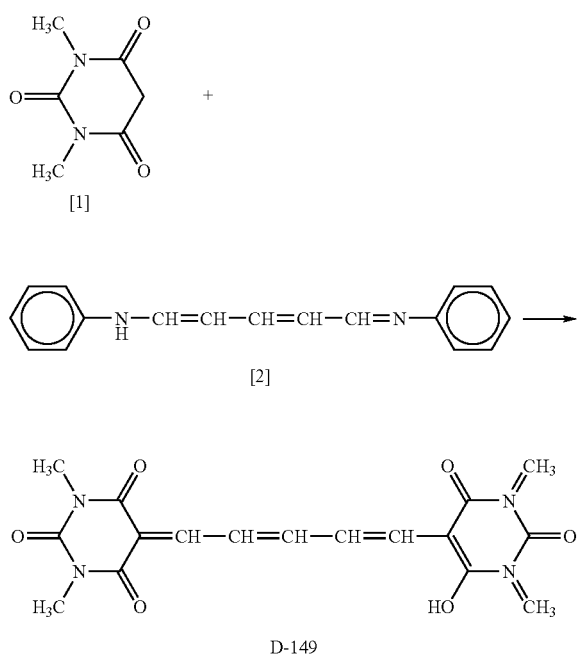

Barbituric acid [1] (3.12 g (20 mmol)), 2.85 g (10 mmol) of anil form [2] and 4.1 g (40 mmol) of triethylamine were dissolved in 30 ml of DMF and stirred at room temperature for 2 hours. Subsequently, dilute hydrochloric acid was added thereto and produced crystals were separated by filtration, washed with water and dried to obtain 2.99 g (yield: 80.0%) of the objective D-149 crystal.

The structure was confirmed by NMR spectrum, MS spectrum and elemental analysis.

Other cyanine dyes, merocyanine dyes, oxonol dyes and the like can also be synthesized according to the methods described, for example, in F. M. Harmer, *Heterocyclic Compounds—Cyanine Dyes and Related Compounds*, John Wiley & Sons, New York, London (1964), and D. M. Sturmer, *Heterocyclic Compounds—Special Topics in Heterocyclic Chemistry*, Chap. 18, Sec. 14, pp. 482-515, John Wiley & Sons, New York, London.

However, the synthesis method of the compounds for use in the present invention is not limited thereto.

Example 2

[Evaluation Method of Two-Photon Absorbing Cross-Sectional Area]

The two-photon absorbing cross-sectional area of the compound for use in the present invention was evaluated by referring to the method described in M. A. Albota et al., *Appl. Opt.*, Vol. 37, page 7352 (1998). In the measurement of the two-photon absorbing cross-sectional area, a Ti:sapphire pulse laser (pulse width: 100 fs, repetition: 80 MH, average output: 1 W, peak power: 100 kW) was used as a light source and the two-photon absorbing cross-sectional area was measured in the wavelength range from 700 to 1,000 nm. Also, rhodamine B and fluoresceine were measured as standard substances and the measured values obtained were corrected by using the two-photon absorbing cross-sectional area values of rhodamine B and fluoresceine described in C. Xu et al., *J. Opt. Soc. Am. B*, Vol. 13, page 481 (1996), whereby the two-photon absorbing cross-sectional area of each compound was obtained. As the sample for the measurement of two-photon absorption, a solution having dissolved therein a compound in a concentration of $1 \times 10^{-4}$ was used.

The two-photon absorbing cross-sectional area of the compound for use in the present invention was measured by the above-described method and the results obtained are shown by the GM unit in Table 1 (1 GM=$1 \times 10^{-50}$ cm$^4$s/photon). The value shown in Table 1 is a maximum value of two-photon absorbing cross-sectional area in the range of measurement wavelength.

Furthermore, the two-photon absorbing cross-sectional area of Comparative Compound 1 described in M. Albota, et al., *Science*, Vol. 281, page 1653 (1998) having the structure shown below was measured by the above-described method and the result obtained is shown in Table 1.

Comparative Compound 1:

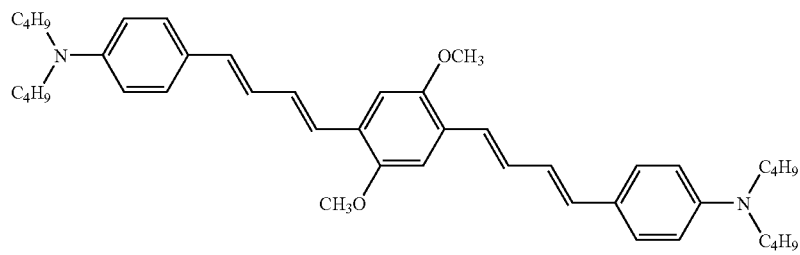

TABLE 1

| Sample | Compound | Solvent | Two-Photon Absorbing Cross-Sectional Area (GM) | Evaluation Wavelength (mm) | Remarks |
|---|---|---|---|---|---|
| 101 | D-11 | DMSO | 29600 | 720 | Invention |
| 102 | D-33 | " | 3450 | 1000 | " |
| 103 | D-35 | " | 2290 | 820 | " |
| 104 | D-42 | " | 2700 | 720 | " |
| 105 | D-42 | methanol | 7070 | 720 | " |
| 106 | D-12 | DMSO | 78000 | 740 | " |
| 107 | D-15 | " | 50200 | 720 | " |
| 108 | D-65 | " | 351700 | 720 | " |
| 109 | D-66 | " | 75100 | 720 | " |
| 110 | D-70 | DMSO | 33800 | 760 | Invention |
| 111 | D-71 | " | 68000 | 740 | " |
| 112 | D-72 | " | 30500 | 720 | " |
| 113 | D-74 | " | 18000 | 780 | " |
| 114 | D-75 | " | 60300 | 720 | " |
| 115 | D-76 | " | 157800 | 720 | " |
| 116 | D-80 | " | 27600 | 760 | " |
| 117 | D-83 | " | 11200 | 760 | " |
| 118 | D-88 | DMSO | 74000 | 740 | " |
| 119 | D-100 | " | 8480 | 740 | " |
| 120 | D-117 | " | 16900 | 720 | " |
| 121 | D-115 | " | 3590 | 820 | " |
| 122 | D-137 | " | 1540 | 720 | " |
| 123 | D-144 | " | 3640 | 820 | " |
| 124 | D-139 | " | 1460 | 740 | " |
| 125 | D-125 | " | 19500 | 720 | " |
| 126 | D-127 | " | 2270 | 740 | " |
| 127 | D-122 | " | 6500 | 960 | " |
| 128 | D-145 | " | 6060 | 780 | " |
| 129 | D-147 | " | 5920 | 760 | " |
| 130 | D-123 | " | 10600 | 700 | " |
| 131 | D-149 | DMSO | 28540 | 720 | " |
| 132 | D-166 | " | 9040 | 760 | " |
| 133 | D-171 | " | 2350 | 720 | " |
| 134 | D-182 | " | 1210 | 740 | " |
| 135 | D-192 | " | 1200 | 740 | " |
| 136 | D-188 | " | 2980 | 820 | " |
| 137 | D-153 | " | 41200 | 720 | " |
| 138 | D-154 | " | 27900 | 720 | " |
| 139 | D-159 | " | 12500 | 720 | " |
| 140 | D-164 | " | 20500 | 720 | " |
| 141 | D-165 | " | 14100 | 720 | " |
| 142 | Comparative Compound 1 | Chloroform | 880 | 760 | Comparison |

As seen from Table 1, the compound for use in the present invention has a very large two-photon absorbing cross-sectional area as compared with Comparative Compound 1.

Example 3

[Formation of Intermolecular Aggregation State]

In 20 ml of water, 2.89 mg of D-1 was dissolved to prepare Aqueous $2\times10^{-4}$ M D-1 Solution (A). Separately, 198 g of water was added to 2 g of gelatin and the gelatin was swelled for 30 minutes while cooling with ice water and then dissolved at 45° C. to prepare Aqueous 1 wt % Gelatin Solution (B).

Thereafter, 5 ml of Aqueous Solution A and 5 ml of Aqueous Solution B were charged into a test tube and mixed to prepare an aqueous 0.5 wt % gelatin•$10^{-4}$ M D-1 solution and this aqueous solution was left standing at 25° C. for 3 hours and then measured on the absorption spectrum. The same operation was performed for D-19 and D-35.

The absorption λmax and ε of D-1, D-19 and D-35 each in an aqueous 0.5 wt % gelatin•$10^{-4}$ M solution and λmax and ε in the monomer state as comparison are shown in Table 2.

As seen from Table 2, in the aqueous gelatin solution system, λmax was shifted to the longer wavelength than the monomer state and moreover, the absorption was very sharp and ε was increased. This clearly reveals that D-1, D-19 and D-35 each could form a so-called intermolecular J-aggregation state in the aqueous gelatin solution system.

TABLE 2

| Sample | Compound | Solvent | Dye Concentration | Absorption, λmax | ε | State |
|---|---|---|---|---|---|---|
| 201 | D-1 | aqueous 0.5 wt % gelatin solution | $10^{-4}$ M | 542 nm | 335000 | J-aggregate |
| 202 | " | methanol | $10^{-4}$ M | 504 nm | 152000 | monomer |
| 203 | D-19 | aqueous 0.5 wt % gelatin solution | $10^{-4}$ M | 481 nm | 230000 | J-aggregate |
| 204 | " | DMSO | $10^{-4}$ M | 449 nm | 85600 | monomer |
| 205 | D-35 | aqueous 0.5 wt % gelatin solution | $10^{-4}$ M | 601 nm | 322000 | J-aggregate |
| 206 | " | DMSO | $10^{-4}$ M | 535 nm | 174000 | monomer |

Example 4

[Evaluation Method of Two-Photon Absorbing Cross-Sectional Area]

The two-photon absorbing cross-sectional area of the compound for use in the present invention was evaluated by referring to the method described in M. A. Albota et al., *Appl. Opt.*, Vol. 37, page 7352 (1998). In the measurement of the two-photon absorbing cross-sectional area, a Ti:saphire pulse laser (pulse width: 100 fs, repetition: 80 MH, average output: 1 W, peak power: 100 kW) was used as a light source and the two-photon absorbing cross-sectional area was measured in the wavelength range from 700 to 1,000 nm. Also, rhodamine B and fluoresceine were measured as standard substances and the measured values obtained were corrected by using the two-photon absorbing cross-sectional area values of rhodamine B and fluoresceine described in C. Xu et al., *J. Opt. Soc. Am. B*, Vol. 13, page 481 (1996), whereby the two-photon absorbing cross-sectional area of each compound was obtained. As samples for the measurement of two-photon absorption, aqueous 0.5 wt % gelatin. $10^{-4}$ M D-1, D-19 and D-35 solutions (in the intermolecular J-aggregation state, Samples 201, 203 and 205) prepared in Example 3 and solutions of these compounds in the monomer state (Samples 202, 204 and 206) as comparison were used.

The two-photon absorbing cross-sectional area of the compound for use in the present invention was measured by the above-described method in the intermolecular aggregation state and in the monomer state as comparison and the results obtained are shown by the GM unit in Table 3 (1 GM=$1\times10^{-50}$ cm$^4$s/photon). The value shown in the Table is a maximum value of two-photon absorbing cross-sectional area in the range of measurement wavelength.

TABLE 3

| Sample | Compound | Solvent | State | Two-Photon Absorbing Cross-Sectional Area, GM | Evaluation Wavelength | Remarks |
|---|---|---|---|---|---|---|
| 201 | D-1 | aqueous 0.5 wt % gelatin solution | J-aggregate | 6280 | 720 nm | Invention |
| 202 | " | methanol | monomer | 891 | 720 nm | Comparison |
| 203 | D-19 | aqueous 0.5 wt % gelatin solution | J-aggregate | 280 | 740 nm | Invention |
| 204 | " | DMSO | monomer | 19 | 840 nm | Comparison |
| 205 | D-35 | aqueous 0.5 wt % gelatin solution | J-aggregate | 6260 | 780 nm | Invention |
| 206 | " | DMSO | monomer | 270 | 740 nm | Comparison |

As apparent from Table 3, by forming an inter-molecular aggregation state, a remarkably large two-photon absorbing cross-sectional area is obtained as compared with the monomer state.

Example 5

[Evaluation Method of Two-Photon Emission Intensity]

On Samples 101, 119 and 129 of Example 2, a Ti:sapphire pulse laser (720 nm) was irradiated to measure the non-resonant two-photon emission spectrum. From the obtained emission spectrum area, the non-resonant two-photon emission intensity was determined.

Comparative Sample 1

As a compound of emitting strong two-photon emission, 0.0059 g of the compound (shown below) described in International Publication No. 97/09043 (W09709043) was dissolved in 100 ml of acetonitrile to prepare a $1 \times 10^{-4}$ M solution.

Comparative Compound: "dye 1" described in WO9709043

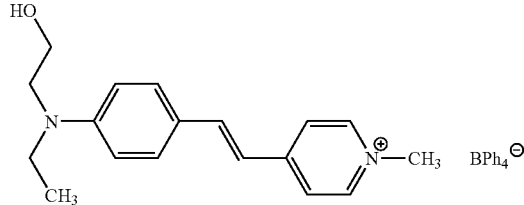

A Ti:sapphire pulse laser (1,000 nm) was irradiated on Comparative Sample 1 to measure the non-resonant two-photon emission spectrum. The obtained emission spectrum areas (non-resonant two-photon emission intensities) are shown in Table 4 as a relative value by taking the value of Comparative Sample 1 as 1.

TABLE 4

| Sample | Compound | Non-Resonant Two-Photon Emission Intensity |
|---|---|---|
| Sample 101 | D-11 | 315 |
| Comparative Sample 1 | "dye 1" of W09709043 | 1 |
| Sample 119 | D-117 | 114 |
| Sample 129 | D-149 | 308 |

As apparent from Table 4, the two-photon absorbing compound of the present invention exhibits a remarkably large non-resonant two-photon emission intensity as compared with Comparative Compound "dye 1".

By using the methine dye of undergoing non-resonant two-photon absorption of the present invention, a non-resonant two-photon absorbing and emitting material capable of giving non-resonant two-photon absorption and two-photon emission by far stronger than conventional materials can be obtained. Furthermore, by using the intermolecular aggregation state of the compound of the present invention, a non-resonant two-photon absorbing and emitting material capable of giving non-resonant two-photon absorption and two-photon emission stronger than the monomer state can be obtained.

The entire disclosure of each and every foreign patent application: Japanese Patent Applications No. 2002-293720, No. 2002-65580, No. 2002-71874, No. 2002-71875 and No. 2003-168028, from which the benefit of foreign priority has been claimed in the present application is incorporated herein by reference, as if fully set forth.

What is claimed is:

1. A method for inducing a non-resonant two-photon absorption, which comprises irradiating a non-resonant two-photon absorbing material comprising an oxonol dye undergoing a non-resonant two-photon absorption with a laser ray having a wavelength longer than the linear absorption band of the dye where the two photon cross-section is at least 1000 GM, which is in the range of 400 to 1,000 nm to induce a two-photon absorption.

2. The method as described in claim 1, wherein the oxonol dye is represented by the following formula (3):

Formula (3):

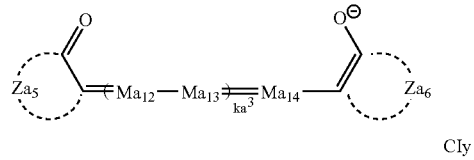

wherein $Za_5$ and $Za_6$ each represents an atomic group for forming a 5- or 6-membered ring,
$Ma_{12}$ to $Ma_{14}$ each independently represents a methine group, which may have a substituent or may form a ring together with another methine group,
$ka^3$ represents an integer of 0 to 3, provided that when $ka^3$ is 2 or more, multiple $Ma_{12}$s may be the same or different and multiple $Ma_{13}$s may be the same or different, CI represents an ion for neutralizing the electric charge, and y represents a number necessary for the neutralization of electric charge.

* * * * *